United States Patent
Fukuzawa et al.

(10) Patent No.: US 8,274,766 B2
(45) Date of Patent: Sep. 25, 2012

(54) MAGNETIC RECORDING ELEMENT INCLUDING A THIN FILM LAYER WITH CHANGEABLE MAGNETIZATION DIRECTION

(75) Inventors: Hideaki Fukuzawa, Kawasaki (JP); Yoshihiko Fuji, Kawasaki (JP); Hiromi Yuasa, Kawasaki (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1237 days.

(21) Appl. No.: 11/783,011

(22) Filed: Apr. 5, 2007

(65) Prior Publication Data

US 2007/0253122 A1    Nov. 1, 2007

(30) Foreign Application Priority Data

Apr. 28, 2006 (JP) ................. P2006-125856

(51) Int. Cl.
*G11B 5/127* (2006.01)
(52) U.S. Cl. .................................. 360/324.11
(58) Field of Classification Search ............. 360/324, 360/324.2, 324.12, 324.11
See application file for complete search history.

(56) References Cited

U.S. PATENT DOCUMENTS

| | | | |
|---|---|---|---|
| 3,775,328 A | 11/1973 | Denes | |
| 4,650,708 A | 3/1987 | Takahashi | |
| 5,116,782 A | 5/1992 | Yamaguchi et al. | |
| 5,139,376 A | 8/1992 | Pumphrey | |
| 5,206,590 A | 4/1993 | Dieny et al. | |
| 5,257,531 A | 11/1993 | Motosugi | |
| 5,287,238 A | 2/1994 | Baumgart et al. | |
| 5,304,975 A | 4/1994 | Saito et al. | |
| 5,313,186 A | 5/1994 | Schuhl et al. | |
| 5,448,515 A | 9/1995 | Fukami et al. | |
| 5,459,687 A | 10/1995 | Sakakima et al. | |
| 5,549,978 A | 8/1996 | Iwasaki et al. | |
| 5,576,915 A * | 11/1996 | Akiyama et al. | 360/314 |
| 5,599,742 A | 2/1997 | Kadomura | |
| 5,653,841 A | 8/1997 | Krishnamurthy | |
| 5,668,688 A | 9/1997 | Dykes et al. | |
| 5,715,121 A | 2/1998 | Sakakima et al. | |
| 5,768,181 A | 6/1998 | Zhu et al. | |
| 5,768,183 A | 6/1998 | Zhu et al. | |
| 5,777,542 A | 7/1998 | Ohsawa et al. | |
| 5,885,750 A | 3/1999 | Hsiao | |
| 5,900,324 A | 5/1999 | Moroishi et al. | |
| 5,923,504 A | 7/1999 | Araki et al. | |
| 5,936,402 A | 8/1999 | Schep et al. | |
| 5,949,622 A * | 9/1999 | Kamiguchi et al. | 360/324.12 |

(Continued)

FOREIGN PATENT DOCUMENTS

CN    1431651    7/2003

(Continued)

OTHER PUBLICATIONS

Office Action in Chinese Application No. 200710102978.9 dated Nov. 28, 2008 and English-language translation thereof.

(Continued)

*Primary Examiner* — Allen Cao
(74) *Attorney, Agent, or Firm* — Nixon & Vanderhye, P.C.

(57) ABSTRACT

A magneto-resistive element includes: a first magnetic layer having a substantially fixed magnetization direction; a thin film layer disposed on the first magnetic layer and having at least one of oxide, nitride, oxynitride, and metal; and a second magnetic layer disposed on the thin film layer and having a substantially fixed magnetization direction.

13 Claims, 19 Drawing Sheets

U.S. PATENT DOCUMENTS

| | | | |
|---|---|---|---|
| 5,962,080 | A | 10/1999 | Tan et al. |
| 6,002,553 | A | 12/1999 | Stearns et al. |
| 6,013,365 | A | 1/2000 | Dieny et al. |
| 6,016,241 | A | 1/2000 | Coffey et al. |
| 6,025,979 | A | 2/2000 | Yamane et al. |
| 6,033,584 | A | 3/2000 | Ngo et al. |
| 6,074,743 | A | 6/2000 | Araki et al. |
| 6,088,195 | A | 7/2000 | Kamiguchi et al. |
| 6,090,498 | A | 7/2000 | Omata et al. |
| 6,096,434 | A | 8/2000 | Yano et al. |
| 6,111,729 | A | 8/2000 | Kamiguchi et al. |
| 6,114,056 | A | 9/2000 | Inomata et al. |
| 6,117,569 | A | 9/2000 | Lin et al. |
| 6,127,045 | A | 10/2000 | Gill |
| 6,132,892 | A | 10/2000 | Yoshikawa et al. |
| 6,159,593 | A | 12/2000 | Iwasaki et al. |
| 6,205,008 | B1 | 3/2001 | Gijs et al. |
| 6,219,275 | B1 | 4/2001 | Nishimura |
| 6,221,518 | B1 | 4/2001 | Araki et al. |
| 6,254,966 | B1 | 7/2001 | Kondo |
| 6,258,470 | B1 | 7/2001 | Sakakima et al. |
| 6,275,363 | B1 | 8/2001 | Gill |
| 6,303,218 | B1 | 10/2001 | Kamiguchi et al. |
| 6,313,973 | B1 | 11/2001 | Fuke et al. |
| 6,330,137 | B1 | 12/2001 | Knapp et al. |
| 6,340,533 | B1 * | 1/2002 | Ueno et al. .................. 428/611 |
| 6,341,052 | B2 | 1/2002 | Hayashi |
| 6,348,274 | B1 | 2/2002 | Kamiguchi et al. |
| 6,353,318 | B1 | 3/2002 | Sin et al. |
| 6,368,706 | B1 | 4/2002 | Iwasaki et al. |
| 6,400,537 | B2 | 6/2002 | Sakakima et al. |
| 6,452,763 | B1 | 9/2002 | Gill |
| 6,469,926 | B1 | 10/2002 | Chen |
| 6,473,275 | B1 | 10/2002 | Gill |
| 6,495,275 | B2 | 12/2002 | Kamiguchi et al. |
| 6,517,896 | B1 | 2/2003 | Horng et al. |
| 6,519,123 | B1 | 2/2003 | Sugawara et al. |
| 6,522,507 | B1 | 2/2003 | Horng et al. |
| 6,538,921 | B2 | 3/2003 | Daughton et al. |
| 6,556,390 | B1 | 4/2003 | Mao et al. |
| 6,560,077 | B2 | 5/2003 | Fujiwara et al. |
| 6,567,246 | B1 * | 5/2003 | Sakakima et al. ....... 360/324.11 |
| 6,603,642 | B1 | 8/2003 | Araki et al. |
| 6,636,391 | B2 | 10/2003 | Watanabe et al. |
| 6,674,615 | B2 | 1/2004 | Hayashi |
| 6,686,068 | B2 | 2/2004 | Carey et al. |
| 6,690,163 | B1 | 2/2004 | Hoshiya et al. |
| 6,707,649 | B2 | 3/2004 | Hasegawa et al. |
| 6,710,984 | B1 | 3/2004 | Yuasa et al. |
| 6,720,036 | B2 | 4/2004 | Tsunekawa et al. |
| 6,754,053 | B2 | 6/2004 | Yoshikawa et al. |
| 6,759,120 | B2 | 7/2004 | Jongill et al. |
| 6,767,655 | B2 | 7/2004 | Hiramoto et al. |
| 6,770,382 | B1 | 8/2004 | Chang et al. |
| 6,828,039 | B2 | 12/2004 | Sugawara |
| 6,853,520 | B2 | 2/2005 | Fukuzawa et al. |
| 6,882,509 | B2 | 4/2005 | Chang et al. |
| 6,903,907 | B2 | 6/2005 | Hasegawa |
| 6,905,780 | B2 | 6/2005 | Yuasa et al. |
| 6,929,957 | B2 | 8/2005 | Min et al. |
| 6,937,446 | B2 | 8/2005 | Kamiguchi et al. |
| 6,937,447 | B2 | 8/2005 | Okuno et al. |
| 7,002,781 | B2 | 2/2006 | Sugawara |
| 7,008,702 | B2 | 3/2006 | Fukuzawa et al. |
| 7,027,328 | B2 * | 4/2006 | Forbes et al. ............ 365/185.01 |
| 7,038,893 | B2 | 5/2006 | Koui et al. |
| 7,046,489 | B2 | 5/2006 | Kamiguchi et al. |
| 7,072,153 | B2 | 7/2006 | Koui et al. |
| 7,116,529 | B2 | 10/2006 | Yoshikawa et al. |
| 7,163,755 | B2 | 1/2007 | Hiramoto et al. |
| 7,177,121 | B2 | 2/2007 | Kojima et al. |
| 7,196,877 | B2 | 3/2007 | Yoshikawa et al. |
| 7,218,484 | B2 | 5/2007 | Hashimoto et al. |
| 7,223,485 | B2 | 5/2007 | Yuasa et al. |
| 7,240,419 | B2 | 7/2007 | Okuno et al. |
| 7,251,110 | B2 | 7/2007 | Lee et al. |
| 7,265,950 | B2 | 9/2007 | Okuno et al. |
| 7,280,323 | B2 | 10/2007 | Sato et al. |
| 7,301,733 | B1 | 11/2007 | Fukuzawa et al. |
| 7,304,825 | B2 | 12/2007 | Funayama et al. |
| 7,307,819 | B2 | 12/2007 | Fukuzawa et al. |
| 7,331,100 | B2 | 2/2008 | Li et al. |
| 7,355,883 | B2 | 4/2008 | Okuno et al. |
| 7,372,672 | B2 | 5/2008 | Nishiyama |
| 7,379,278 | B2 | 5/2008 | Koui et al. |
| 7,390,529 | B2 | 6/2008 | Li et al. |
| 7,405,906 | B2 | 7/2008 | Funayama et al. |
| 7,453,672 | B2 | 11/2008 | Dieny et al. |
| 7,476,414 | B2 | 1/2009 | Fukuzawa et al. |
| 7,476,954 | B2 * | 1/2009 | Wang et al. .................... 257/421 |
| 7,495,870 | B2 | 2/2009 | Yuasa et al. |
| 7,514,117 | B2 | 4/2009 | Fukuzawa et al. |
| 7,522,390 | B2 | 4/2009 | Yuasa et al. |
| 7,525,776 | B2 | 4/2009 | Fukuzawa et al. |
| 7,583,480 | B2 | 9/2009 | Sbiaa et al. |
| 7,602,592 | B2 | 10/2009 | Fukuzawa et al. |
| 7,610,674 | B2 | 11/2009 | Zhang et al. |
| 7,776,387 | B2 | 8/2010 | Fuji et al. |
| 7,782,575 | B2 | 8/2010 | Tsuchiya et al. |
| 7,785,662 | B2 | 8/2010 | Fuji et al. |
| 7,791,843 | B2 | 9/2010 | Kamiguchi et al. |
| 7,808,747 | B2 | 10/2010 | Fuji et al. |
| 7,810,228 | B2 | 10/2010 | Yuasa et al. |
| 7,821,748 | B2 | 10/2010 | Fukuzawa et al. |
| 7,842,334 | B2 | 11/2010 | Wakui et al. |
| 7,851,840 | B2 * | 12/2010 | Diao et al. .................... 257/295 |
| 7,897,201 | B2 | 3/2011 | Yuasa et al. |
| 7,978,442 | B2 | 7/2011 | Zhang et al. |
| 7,986,498 | B2 | 7/2011 | Wang et al. |
| 8,031,443 | B2 | 10/2011 | Fuke et al. |
| 8,048,492 | B2 | 11/2011 | Fukuzawa et al. |
| 8,049,999 | B2 | 11/2011 | Fukuzawa et al. |
| 8,111,489 | B2 | 2/2012 | Fuji et al. |
| 8,153,188 | B2 | 4/2012 | Fukuzawa et al. |
| 8,169,752 | B2 | 5/2012 | Fukuzawa et al. |
| 8,184,408 | B2 | 5/2012 | Murakami et al. |
| 2001/0005300 | A1 | 6/2001 | Hayashi |
| 2001/0009063 | A1 | 7/2001 | Saito et al. |
| 2001/0014000 | A1 * | 8/2001 | Tanaka et al. ............ 360/324.12 |
| 2001/0040781 | A1 | 11/2001 | Tanaka et al. |
| 2002/0048127 | A1 | 4/2002 | Fukuzawa et al. |
| 2002/0048128 | A1 | 4/2002 | Kamiguchi et al. |
| 2002/0051380 | A1 | 5/2002 | Kamiguchi et al. |
| 2002/0054461 | A1 | 5/2002 | Fujiwara et al. |
| 2002/0058158 | A1 | 5/2002 | Odagawa et al. |
| 2002/0073785 | A1 | 6/2002 | Prakash et al. |
| 2002/0097536 | A1 | 7/2002 | Komuro et al. |
| 2002/0114974 | A1 | 8/2002 | Carey et al. |
| 2002/0126428 | A1 * | 9/2002 | Gill ......................... 360/324.12 |
| 2002/0135935 | A1 | 9/2002 | Covington |
| 2002/0145835 | A1 | 10/2002 | Suzuki et al. |
| 2002/0150791 | A1 | 10/2002 | Yuasa et al. |
| 2002/0159201 | A1 | 10/2002 | Li et al. |
| 2002/0191355 | A1 | 12/2002 | Hiramoto et al. |
| 2003/0011463 | A1 | 1/2003 | Iwasaki et al. |
| 2003/0026049 | A1 | 2/2003 | Gill |
| 2003/0035256 | A1 | 2/2003 | Hayashi et al. |
| 2003/0049389 | A1 | 3/2003 | Tsunekawa et al. |
| 2003/0053269 | A1 | 3/2003 | Nishiyama |
| 2003/0053270 | A1 * | 3/2003 | Gill ......................... 360/324.11 |
| 2003/0099868 | A1 | 5/2003 | Tanahashi et al. |
| 2003/0104249 | A1 | 6/2003 | Okuno et al. |
| 2003/0123200 | A1 | 7/2003 | Nagasaka et al. |
| 2003/0128481 | A1 | 7/2003 | Seyama et al. |
| 2003/0156360 | A1 | 8/2003 | Kawawake et al. |
| 2004/0017639 | A1 | 1/2004 | Deak |
| 2004/0021990 | A1 | 2/2004 | Koui et al. |
| 2004/0042127 | A1 | 3/2004 | Hoshiya et al. |
| 2004/0121185 | A1 | 6/2004 | Fukuzawa et al. |
| 2004/0137645 | A1 | 7/2004 | Hu et al. |
| 2004/0150922 | A1 | 8/2004 | Kagami et al. |
| 2004/0169963 | A1 | 9/2004 | Okuno et al. |
| 2004/0201929 | A1 | 10/2004 | Hashimoto et al. |
| 2004/0206619 | A1 | 10/2004 | Pinarbasi |
| 2004/0246631 | A1 | 12/2004 | Dieny et al. |
| 2005/0042478 | A1 | 2/2005 | Okuno et al. |
| 2005/0047028 | A1 | 3/2005 | Fukuzawa et al. |

| | | | | | | |
|---|---|---|---|---|---|---|
| 2005/0063104 A1 | 3/2005 | Takagishi et al. | | JP | 08-049063 | 2/1996 |
| 2005/0068855 A1 | 3/2005 | Morikawa et al. | | JP | 09-116212 | 5/1997 |
| 2005/0073778 A1* | 4/2005 | Hasegawa et al. ......... 360/324.1 | | JP | 09-306733 | 11/1997 |
| 2005/0094317 A1 | 5/2005 | Funayama | | JP | 10-173252 | 6/1998 |
| 2005/0094322 A1 | 5/2005 | Fukuzawa et al. | | JP | 10-324969 | 12/1998 |
| 2005/0094327 A1 | 5/2005 | Okuno et al. | | JP | 11-121832 | 4/1999 |
| 2005/0141148 A1 | 6/2005 | Aikawa et al. | | JP | 11-154609 | 6/1999 |
| 2005/0168887 A1 | 8/2005 | Yuasa et al. | | JP | 11-238923 | 8/1999 |
| 2005/0276998 A1 | 12/2005 | Sato | | JP | 11-510911 | 9/1999 |
| 2006/0002184 A1 | 1/2006 | Hong et al. | | JP | 11-293481 | 10/1999 |
| 2006/0018057 A1 | 1/2006 | Huai | | JP | 11-296820 | 10/1999 |
| 2006/0034022 A1 | 2/2006 | Yuasa et al. | | JP | 2000-137906 | 5/2000 |
| 2006/0050444 A1 | 3/2006 | Fukuzawa et al. | | JP | 2000-156530 | 6/2000 |
| 2006/0077596 A1 | 4/2006 | Yuasa et al. | | JP | 2000-188435 | 7/2000 |
| 2006/0098353 A1 | 5/2006 | Fukuzawa et al. | | JP | 2000-215414 | 8/2000 |
| 2006/0114620 A1 | 6/2006 | Sbiaa et al. | | JP | 2000-228004 | 8/2000 |
| 2006/0164764 A1 | 7/2006 | Kamiguchi et al. | | JP | 2000-293982 | 10/2000 |
| 2006/0188750 A1* | 8/2006 | Ide et al. ............... 428/812 | | JP | 2001-094173 | 4/2001 |
| 2007/0070556 A1 | 3/2007 | Zhang et al. | | JP | 2001-143227 | 5/2001 |
| 2007/0081276 A1 | 4/2007 | Fukuzawa et al. | | JP | 2001-176027 | 6/2001 |
| 2007/0091511 A1 | 4/2007 | Hoshiya et al. | | JP | 2001-229511 | 8/2001 |
| 2007/0092639 A1 | 4/2007 | Fuji et al. | | JP | 2001-237471 | 8/2001 |
| 2007/0159733 A1 | 7/2007 | Hashimoto et al. | | JP | 2001-358380 | 12/2001 |
| 2007/0172690 A1 | 7/2007 | Kim et al. | | JP | 2002-076473 | 3/2002 |
| 2007/0188936 A1 | 8/2007 | Zhang et al. | | JP | 2002-124721 | 4/2002 |
| 2007/0188937 A1 | 8/2007 | Carey et al. | | JP | 2002-150512 | 5/2002 |
| 2007/0202249 A1 | 8/2007 | Yuasa et al. | | JP | 2002-204010 | 7/2002 |
| 2007/0253122 A1 | 11/2007 | Fukuzawa et al. | | JP | 2002-208744 | 7/2002 |
| 2007/0259213 A1 | 11/2007 | Hashimoto et al. | | JP | 2003-086866 | 3/2003 |
| 2008/0005891 A1 | 1/2008 | Yuasa et al. | | JP | 2003-110168 | 4/2003 |
| 2008/0008909 A1 | 1/2008 | Fuji et al. | | JP | 2003-152243 | 5/2003 |
| 2008/0013218 A1 | 1/2008 | Fuke et al. | | JP | 2003-204095 | 7/2003 |
| 2008/0042779 A1 | 2/2008 | Carey et al. | | JP | 2004-006589 | 1/2004 |
| 2008/0061388 A1* | 3/2008 | Diao et al. ............. 257/421 | | JP | 2004-153248 | 5/2004 |
| 2008/0062577 A1 | 3/2008 | Fukuzawa et al. | | JP | 2004-214234 | 7/2004 |
| 2008/0068764 A1 | 3/2008 | Fukuzawa et al. | | JP | 2005-097693 | 4/2005 |
| 2008/0080098 A1 | 4/2008 | Fuke et al. | | JP | 2005-136309 | 5/2005 |
| 2008/0102315 A1 | 5/2008 | Fukuzawa et al. | | JP | 2005-166896 | 6/2005 |
| 2008/0106826 A1 | 5/2008 | Funayama et al. | | JP | 2005-191101 | 7/2005 |
| 2008/0123223 A1* | 5/2008 | Ide et al. .............. 360/324.2 | | JP | 2005-285936 | 10/2005 |
| 2008/0192388 A1 | 8/2008 | Zhang et al. | | JP | 2005-339784 | 12/2005 |
| 2008/0204944 A1 | 8/2008 | Aikawa et al. | | JP | 2005-353236 | 12/2005 |
| 2008/0239590 A1 | 10/2008 | Fuke et al. | | JP | 2006-019743 | 1/2006 |
| 2008/0278864 A1 | 11/2008 | Zhang et al. | | JP | 2006-041266 | 2/2006 |
| 2008/0311431 A1 | 12/2008 | Fuji et al. | | JP | 2006-049426 | 2/2006 |
| 2009/0059441 A1 | 3/2009 | Zhang et al. | | JP | 2006-054257 | 2/2006 |
| 2009/0061105 A1 | 3/2009 | Fukuzawa et al. | | JP | 2006-114610 | 4/2006 |
| 2009/0091864 A1 | 4/2009 | Carey et al. | | JP | 2006-135253 | 5/2006 |
| 2009/0091865 A1 | 4/2009 | Zhang et al. | | JP | 2006-319343 | 11/2006 |
| 2009/0104475 A1 | 4/2009 | Fuji et al. | | JP | 2007-221135 | 8/2007 |
| 2009/0109581 A1 | 4/2009 | Fukuzawa et al. | | JP | 2007-266122 | 10/2007 |
| 2009/0141408 A1 | 6/2009 | Fukuzawa et al. | | JP | 2008-016740 | 1/2008 |
| 2009/0162698 A1 | 6/2009 | Fukuzawa et al. | | JP | 2008-016741 | 1/2008 |
| 2009/0225477 A1 | 9/2009 | Fukuzawa et al. | | KR | 10-0302029 | 6/2001 |
| 2009/0229111 A1* | 9/2009 | Zhao et al. ............ 29/603.08 | | KR | 2001-0081971 | 8/2001 |
| 2010/0037453 A1 | 2/2010 | Zhang et al. | | KR | 2002-0015295 | 2/2002 |
| 2010/0091412 A1 | 4/2010 | Yuasa et al. | | KR | 10-2005-0027159 | 3/2005 |
| 2010/0091414 A1 | 4/2010 | Yuasa et al. | | KR | 10-2005-0118649 | 12/2005 |
| 2010/0091415 A1 | 4/2010 | Yuasa et al. | | KR | 10-2006-0050327 | 5/2006 |
| 2010/0092803 A1 | 4/2010 | Yuasa et al. | | WO | 97/47982 | 12/1997 |
| 2010/0323104 A1 | 12/2010 | Yuasa et al. | | WO | 03/032338 | 4/2003 |
| 2011/0205669 A1 | 8/2011 | Murakami et al. | | WO | 2007/072987 | 6/2007 |
| 2012/0050920 A1 | 3/2012 | Takeo et al. | | | | |

FOREIGN PATENT DOCUMENTS

| | | |
|---|---|---|
| CN | 1183517 | 1/2005 |
| CN | 1746980 | 3/2006 |
| EP | 0 687 917 | 12/1995 |
| EP | 0 877 398 | 11/1998 |
| EP | 1 328 027 | 7/2003 |
| EP | 1 400 957 | 3/2004 |
| EP | 1 548 762 | 6/2005 |
| EP | 1 607 941 | 12/2005 |
| EP | 1 626 393 | 2/2006 |
| GB | 2 390 168 | 12/2003 |
| JP | 60-098518 | 6/1985 |
| JP | 02-173278 | 7/1990 |
| JP | 05-160123 | 6/1993 |
| JP | 07-022399 | 1/1995 |

OTHER PUBLICATIONS

Office Action issued on Sep. 5, 2008, in Korean Patent Application No. 2007-41050 and English-language translation thereof.
Yonsei University Master Thesis, "Voltage Difference Amplification Circuit for Improving the Sensing Characteristics of MRAM", Dec. 2005 and brief English-language translation thereof.
Seoul University Doctoral Thesis, A Study on the Development of New Spin Wave Structures for Magnetoresistive RAM based on Giant Magentoresistance and Tunneling, Aug. 2001 and brief English-language translation thereof.
English-language translation of office Action issued on Sep. 5, 2008, in Korean Patent Application No. 2007-41050.
Ceramist vol. 4 No. 5, Special Edition, "Magnetic Sensor Technologies and Applications Using Giant Magentoresistance Effect", Oct. 2001.

S. Sanvito, et al. "Breakdown of the Resistor Model of CPP-GMR in Magnetic Multilayered Nanostructures", Physical Review B, vol. 61, No. 20, May 15, 2000, pp. 14225-14228. (Abstract).

Didier Bozec, et al., "Mean Free Path Effects on the Current Perpendicular to the Plane Magnetoresistance of Magnetic Multilayers", Physical Review Letters, vol. 85, No. 6, Aug. 7, 2000, pp. 1314-1317. (Abstract).

B. Dieny, et al., "Magnetotransport Properties of Magnetically Soft Spin-Valve Structures (Invited)", J. Appl. Phys., vol. 69 (8), Apr. 15, 1991, pp. 4774-4779.

Dieny et al., "Giant Magnetoresistance of Magnetically Soft Sandwiches: Dependence on Temperature and on Layer Thicknesses", Physical Review B, vol. 45, No. 2, Jan. 1, 1992, pp. 806-813.

D. Bozec, et al., "Comparative Study of the Magnetoresistance of MBE-Grown Multilayers: $[Fe/Cu/Co/Cu]_N$ and $[Fe/Cu]_N [Co/Cu]_N$" Physical Review B, vol. 60, No. 5, Aug. 1, 1999, pp. 3037-3039. (Abstract).

Hideaki Fukuzawa, et al., "MR Ratio Enhancement by NOL Current-Confined-Path Structures in CPP Spin Valves", IEEE Transactions on Magnetics, Jul. 2004, vol. 40, No. 4, pp. 2236-2238.

Takagishi, M. et al., "The Applicability of CPP-GMR Heads for Magnetic Recording", IEEE Transactions on Magnetics, vol. 38, No. 5, pp. 2277-2282, (Sep. 2002).

A. Losev et al., "Electron Beam Induced Reduction Ofof CuO in the Presence of a Surface Carbonaceous Layer: An XPS/Hreels Study", Surface Science 213 (1989) pp. 554-579.

K.S. Kim et al., "X-Ray Photoelectron Spectroscopic Studies of Nickel-Oxygen Surfaces Using Oxygen and Argon Ion-Bombardment", Surface Science 43 (1974), pp. 625-643.

N. Garcia, et al. "Magnetoresistance in Excess of 200% in Ballistic Ni Nanocontacts at Room Temperature and 100 Oe," Physical Review Letters, vol. 82, No. 14, Apr. 5, 1999, pp. 2923-2926.

J.J. Versluijs, et al., "Magnetoresistance of Half-Metallic Oxide Nanocontracts," Physical Review Letters, vol. 87, No. 2, Jul. 9, 2001, pp. 026601-1 through 026601-4.

W.F. Egelhoff, et al., "Oxygen as a Surfactant in the Growth of Giant Magnetoresistance Spin Valves", J Appl. Phys., vol. 82, No. 12, pp. 6142-6151, Dec. 15, 1997.

Y. Kamiguchi et al., "CoFe Specular Spin Valves With a Nano Oxide Layer", The 1999 IEEE International Magnetics Conference, May 18-21, 1999.

H.A. Ferrera et al. "Rapid DNA hybridization based on ac field focusing of magnetically labeled target DNA"; Applied Physics Letters, 87, 013901 (2005); pp. 013901-1 to 013901-3.

L. Lagae et al. "Magnetic biosensors for genetic screening of cystic fibrosis"; IEE Proc. Circuits Devices Syst. vol. 152, No. 4, Aug. 2005, pp. 393-400.

Meguro, K., Hoshiya, H., Watanabe, K., Hamakawa, Y., and Fuyama, M., "Spin-valve films using syntehtic ferrimagnets for pinned layer," (IEEE Trans. Mag., 35(5), 1999, 2925-2927. (Abstract).

C. Vouille et al, J.Appl.Phys. 81 4573 (1997); "Inverse CPP-GMR in (A/Cu/Co/Cu) multilayers . . . by impurities" (Abstract).

A.C. Reilly et al, J.Magn. Magn. Mater, 195 (1999) L269; "Perpendicular giant magnetoresistance of . . . unified picture." (Abstract).

J. Bass et al, J. Magn. Magn. Mater, 200 (1999) 274; "Current-perpendicular (CPP) magnetoresistance in magnetic metallic multilayers." (Abstract).

L. Villa, et al., Journal of Applied Physics, vol. 87, No. 12, pp. 8610-8614, Current Perpendicular Magnetoresistances of NiFeCo and NiFe "Permalloys", Jun. 15, 2000. (Abstract).

Nagasaka et al., "Giant magnetoresistance properties of specular spin valve films in a current perpendicular to plane structure," J. Appl. Phys., vol. 89, No. 11, pp. 6943-4965.

Mazin, "How to Define and Calculate the Degree of Spin Polarization in Ferromagnets", Physical Review Letters, vol. 83, No. 7, Aug. 16, 1999, pp. 1427-1430.

Fukuzawa et al., U.S. Appl. No. 11/001,174, filed Dec. 2, 2004.
Fukuzawa et al., U.S. Appl. No. 11/199,448, filed Aug. 9, 2005.
Fuji et al., U.S. Appl. No. 11/583,968, filed Oct. 20, 2006.
Yuasa et al., U.S. Appl. No. 11/703,830, filed Feb. 8, 2007.
Fuji et al., U.S. Appl. No. 11/802,474, filed May 23, 2007.
Fuke et al., U.S. Appl. No. 11/822,700, filed Jul. 9, 2007.
Fuke et al., U.S. Appl. No. 11/892,890, filed Aug. 28, 2007.
Zhang et al., U.S. Appl. No. 11/906,716, filed Oct. 3, 2007.
Fuke et al., U.S. Appl. No. 12/071,589, filed Feb. 22, 2008.
Fukuzawa et al., U.S. Appl. No. 12/086,761, filed Jun. 19, 2008.
Fukuzawa et al., U.S. Appl. No. 12/248,578, filed Oct. 9, 2008.
Fuji et al., U.S. Appl. No. 12/314,811, filed Dec. 17, 2008.
Fukuzawa et al., U.S. Appl. No. 12/347,543, filed Dec. 31, 2008.
Yuasa et al., U.S. Appl. No. 12/585,851, filed Sep. 25, 2009.
Yuasa et al., U.S. Appl. No. 12/585,852, filed Sep. 25, 2009.
Yuasa et al., U.S. Appl. No. 12/585,854, filed Sep. 25, 2009.
Yuasa et al., U.S. Appl. No. 12/585,855, filed Sep. 25, 2009.

* cited by examiner

MAGNETIC RECORDING ELEMENT INCLUDING A THIN FILM LAYER WITH CHANGEABLE MAGNETIZATION DIRECTION

CROSS REFERENCE TO THE INVENTION

This application is based upon and claims the benefit of priority from the prior Japanese Patent Application No. 2006-125856, filed on Apr. 28, 2006; the entire contents of which are incorporated herein by reference.

BACKGROUND OF THE INVENTION

1. Field of the Invention

The present invention relates to a magneto-resistive element that senses magnetism by supplying a sense current to a magneto-resistive film.

2. Description of the Related Art

Magnetic devices, in particular, magnetic heads have made a remarkable improvement in their performance by using a giant magneto-resistive effect (GMR). The application of a spin-valve film (SV film) especially to magnetic heads, MRM (Magnetic Random Access Memories), and the like has led to a great technical progress in a magnetic device field.

The "spin-valve film" is a multilayer film including a structure in which a nonmagnetic spacer layer is interposed between two ferromagnetic layers, and a portion of the multilayer film structure where a resistance change occurs is called a spin-dependent scattering unit. Magnetization of one of the two ferromagnetic layers (called "a pinned layer", "a magnetization fixed layer", or the like) is fixed by an antiferromagnetic layer or the like, whereas a magnetization direction of the other ferromagnetic layer (called "a free layer", "a magnetization free layer", or the like) is rotatable depending on an external magnetic field. In the spin-valve film, a change of a relative angle of the magnetization directions of the pinned layer and the free layer produces a giant magneto-resistance. Here, the spacer layer magnetically separates the pinned layer and the free layer from each other to allow the magnetization directions of these layers to move independently.

Magneto-resistive effect elements using a spin valve film include a CIP (Current-In-Plane)-GMR element, a CPP (Current-Perpendicular-to-Plane)-GMR element, and a TMR (Tunneling Magneto Resistance) element. In the CIP-GMR element, a sense current is supplied in parallel to a plane of the spin valve film, while in the CPP-GMR element and the TMR element, a sense current is supplied substantially perpendicularly to the plane of the spin valve film.

In the current-perpendicular-to-plane type, a spacer layer in the TMR element is an insulation layer, and a spacer layer in a normal CPP-GMR element is a metal layer. As a developed form of the CPP-GMR element, there has also been proposed a magneto-resistive element in which a spacer layer is an oxide layer including a nano-size metal current path penetrating in a thickness direction [NOL (nano-oxide layer)]. This spacer layer has a current-confined-path (CCP) for causing metal conduction in part of the NOL (see JP-A 2002-208744 (KOKAI)).

SUMMARY OF THE INVENTION

A magneto-resistive element according an embodiment of the present invention includes: a first magnetic layer having a substantially fixed magnetization direction; a thin film layer disposed on the first magnetic layer and having at least one of oxide, nitride, oxynitride, and metal; and a second magnetic layer disposed on the thin film layer and having a substantially fixed magnetization direction.

DESCRIPTION OF THE EMBODIMENTS

Hereinafter, embodiments of the present invention will be described with reference to the drawings. In the embodiments below, the composition of an alloy is expressed in atomic %.

Figure 1:
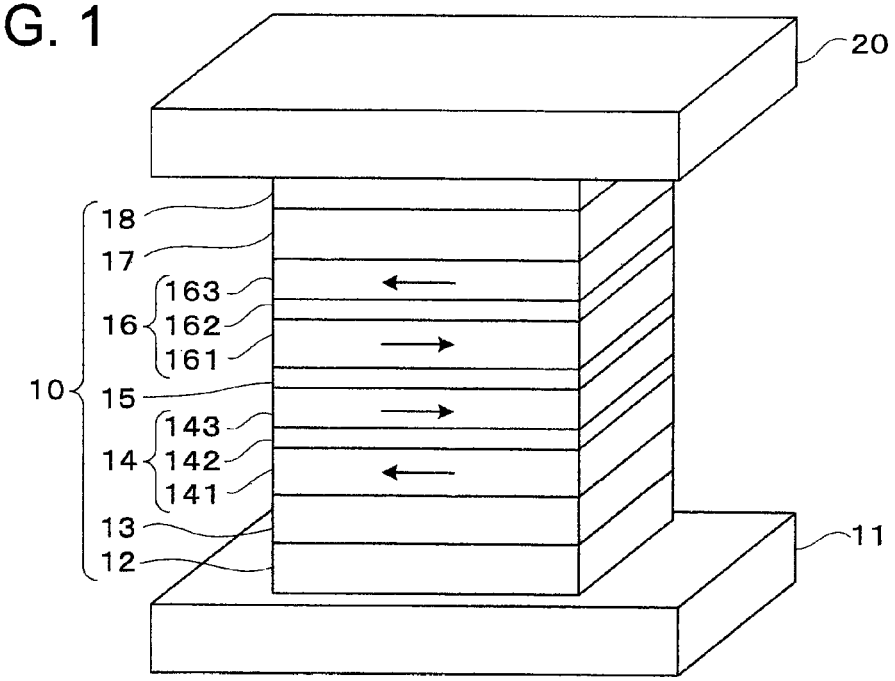
FIG. 1 is a perspective view showing a magneto-resistive element according to an embodiment of the present invention.

FIG. 1 is a perspective view showing a magneto-resistive element according to an embodiment of the present invention. FIG. 1 and the other drawings are all schematic views, and a thickness ratio in the drawings is not necessarily equal to an actual thickness ratio.

As shown in FIG. 1, a magneto-resistive element according to an embodiment has a magneto-resistive film 10 and a lower and an upper electrode 11, 20 sandwiching the magneto-resistive film 10 from above and under, and is formed on a substrate not shown. The magneto-resistive film 10 is comprised of a base layer 12, a pinning layer 13, a pinned layer 14, an external magnetic field sensing layer 15, a pinned layer 16, a pinning layer 17, and a cap layer 18, which are stacked in this order. Among these layers, the pinned layer 14, the external magnetic field sensing layer 15, and the pinned layer 16 correspond to a basic film structure exhibiting a magneto-resistive effect, that is, a spin-dependent scattering unit.

(Basic Structure of Magneto-Resistive Film 10)

Figure 2:
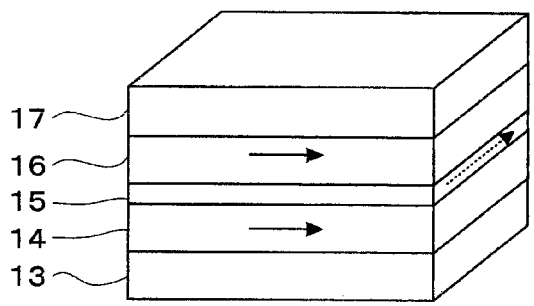
FIG. 2 is a perspective view showing the basic structure of a magneto-resistive film according to the embodiment.
Figure 3:
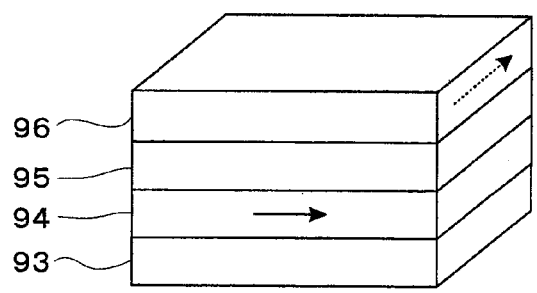
FIG. 3 is a perspective view showing the basic structure of a conventional spin-valve film.

The magneto-resistive film 10 shown in FIG. 2 is greatly different in structure from a conventional spin-valve film 90 shown in FIG. 3.

FIG. 2 and FIG. 3 are a perspective view showing the basic structure of a magneto-resistive film according to the embodiment. As described above, in the magneto-resistive film 10, the pinning layer 13, the pinned layer 14, the external magnetic field sensing layer 15, the pinned layer 16, and the pinning layer 17 are stacked. On the other hand, in the spin-valve film 90, a pinning layer 93, a pinned layer 94, a spacer layer 95, and a free layer 96 are stacked.

In the spin valve film 90, a spin-dependent scattering unit exhibiting a magneto-resistive effect has a three-layer structure of the pinned layer 94, the spacer layer 95, and the free layer 96. A magnetization direction of the pinned layer 94 is fixed, while a magnetization direction of the free layer 96 changes depending on an external magnetic field. The spacer layer 95 separates magnetic coupling between the pinned layer 94 and the free layer 96, so that the magnetization directions of the pinned layer 94 and the free layer 96 are kept independent from each other. Depending on the external magnetic field, a relative angle of the magnetization directions of the pinned layer 94 and the free layer 96 is changed, and based on the resultant magneto-resistance, magnetism can be sensed.

On the other hand, in the magneto-resistive film 10, the pinned layer 14, the external magnetic field sensing layer 15, and the pinned layer 16 constitute the three-layer structure of the spin-dependent scattering unit exhibiting the magneto-resistive effect. That is, in the magneto-resistive film 10, there is no mechanism such as the spacer layer 95 positively separating the magnetic coupling, but the pinned layer 16 and the external magnetic field sensing layer 15 are directly close to each other.

In the conventional spin-valve film 90, the spacer layer 95 is a nonmagnetic layer. However, electrons conducted in the spacer layer 95 flow from magnetic layers (the pinned layer 94 and the free layer 96) and thus have spin information. To realize a larger resistance variation, it is important to prevent the spin information of the conduction electrons from being lost in the spacer layer 95. However, in an actually fabricated spacer layer 95, a completely ideal state cannot be realized, and influences of crystal defects, impurity elements, and the like cause a spin-flip phenomenon. This will be a cause of a decrease in resistance variation.

On the other hand, the magneto-resistive film 10 does not have a spacer layer and is free from the influence by such spin flip of conduction electrons. This can achieve a larger resistance variation. The magneto-resistive film 10 can function as a spin-valve film even without a spacer layer. The operation mechanism of the magneto-resistive film 10 will be described later.

The number of layers in the spin-dependent unit of the magneto-resistive film 10 is the same as that of the spin-valve layer 90. However, not having a spacer layer (mechanism for positively separating the magnetic coupling), the magneto-resistive film 10 can function in practice as a dual spin-valve film by the pinned layers 14, 16.

A typical dual spin-valve film has a five-layer structure of a pinned layer/a spacer layer/a free layer/a spacer layer/a pinned layer. Capable of functioning as the dual spin-valve layer by the three layers (being relatively thin), the magneto-resistive film 10 can easily increase a magneto-resistance ratio.

In order for the magneto-resistive film 10 without a spacer layer to exhibit a magneto-resistive effect, a material of the external magnetic field sensing layer 15 needs to be appropriately selected. As the external magnetic field sensing layer 15, used is an ultrathin oxide layer, nitride layer, oxynitride layer, or metal layer. Ti, V, Cr, Mn, Fe, Co, Ni, Zr, Pd, Nb, W, Mo, Ta, or the like is used as a base material of the oxide layer, nitride layer, or oxynitride layer. For the metal layer, a metal material containing an element such as Ti, V, Cr, or Mn is used.

At this time, as the oxide layer, the nitride layer, the oxynitride layer, or the like, an ultrathin layer (thin film layer) of about 0.5 nm to 3 nm is used. This can realize a large magneto-resistance ratio without causing any resistance increase. In a case where the metal material is used, even the use of a film thicker than 3 nm can control a resistance to a low value. Therefore, in the case where the metal material is used, an allowable thickness range is up to about 5 nm, including 0.5 nm to 3 nm.

(Details of Magneto-Resistive Element)

Hereinafter, the magneto-resistive element of this embodiment will be described in detail.

The lower electrode 11 supplies an electric current in a direction perpendicular to a plane of a spin-valve film. Applying a voltage between the lower electrode 11 and the upper electrode 20 causes an electric current to flow in the spin-valve film perpendicularly to the plane. By detecting resistance variation caused by a magneto-resistive effect based on this current, it is possible to sense magnetism. As the lower electrode 11, a metal layer relatively low in electrical resistance is used to supply the electric current to the magneto-resistive element.

The base layer 12 can be divided into, for example, a buffer layer 12a and a seed layer 12b. The buffer layer 12a buffers roughness of a surface of the lower electrode 11. The seed layer 12b controls crystal orientation and crystal grain size of the spin-valve film formed thereon.

As a material of the buffer layer 12a, usable is Ta, Ti, W, Zr, Hf, Cr, or an alloy of any of these elements. A preferable thickness range of the buffer layer 12a is from about 1 nm to about 10 nm, more preferably from about 2 nm to about 5 nm. The buffer layer 12a, if too thin, cannot exhibit the buffer effect. On the other hand, the buffer layer 12a, if too thick, leads to an increase in serial resistance not contributing to the magneto-resistance ratio. Incidentally, if the seed layer 12b formed on the buffer layer 12a has the buffer effect, the formation of the buffer layer 12a is not indispensable. As a preferable example satisfying the above conditions, Ta [3 nm] is usable as the buffer layer 12a.

The seed layer 12b may be made of any material capable of controlling the crystal orientation of the layer formed thereon. As the seed layer 12b, preferable is a metal layer or the like having a fcc structure (face-centered cubic structure), a hcp structure (hexagonal close-packed structure), or a bcc structure (body-centered cubic structure).

For example, if the seed layer 12b made of hcp-Ru or fcc-NiFe 12b is used, the spin-valve film formed thereon can have fcc (111) crystal orientation. Further, the pinning layer 13 (for example, IrMn) can have fcc (face-centered cubic) crystal orientation.

In order for the seed layer 12b to fully exhibit its function of improving the crystal orientation, a thickness range of the seed layer 12b is preferably from 1 nm to 5 nm, more preferably from 1.5 nm to 3 nm. Ru [2 nm] is a preferable example of a material of the seed layer 12b satisfying the above-described conditions.

Crystal orientation of the spin-valve film and the pinning layer 13 can be measured by X-ray diffraction. When a full-width at half-maximum of a rocking curve at a fcc(111) peak of the spin-valve film and at a fct(111) peak or a bcc(110) peak of the pinning layer 13 (PtMn) is 3.5 degrees to 6 degrees, it is possible to attain good orientation. This dispersion angle of the orientation can also be found from a diffraction spot by using a cross-section TEM.

Also usable as the seed layer 12b instead of Ru is a NiFe-based alloy (for example, $Ni_xFe_{100-x}$ (x=90% to 50%, preferably 75% to 85%) or $(Ni_xFe_{100-x})_{100-y}Z_y$ (Z=Cr, V, Nb, Hf, Zr, Mo) in which NiFe is made nonmagnetic by adding a third element Z thereto). With the NiFe-based seed layer 12b, good crystal orientation can be obtained relatively easily, and 3 degrees to 5 degrees can be obtained as the full-width at half-maximum of a rocking curve measured in the same manner as above.

In addition to the function of improving the crystal orientation, the seed layer 12b has a function of controlling the crystal grain size of the spin-valve film. Specifically, the seed layer 12b can control the crystal grain size of the spin-valve film to 5 nm to 20 nm. As a result, even if the magneto-resistive element is small in size, characteristic variation can be prevented. Further, not only the spin-valve film having crystal grains but also a spin-valve film with an amorphous structure (whose crystal grain size is so small as to be considered as an extremity state) is usable.

The crystal grain size of the spin-valve film can be found from the grain size of crystal grains in the pinning layer 13 and the pinned layer 14 formed on the seed layer 12b. The grain size can be measured by, for example, a cross-section TEM or the like.

In a reproducing head adapted to high-density recording, an element size is, for example, 50 nm or less. A large ratio of the crystal grain size to the element size will be a cause of characteristic variation of the element. A small number of crystal grains per element area will be a cause of characteristic variation ascribable to the small number of crystals, and therefore, increasing the crystal grain size is not very desirable. The crystal grain size exceeding 20 nm in the spin-valve film is not desirable.

On the other hand, an extremely small grain size generally makes it difficult to maintain good crystal orientation. Specifically, a preferable range of the crystal grain size is from 3 nm to 20 nm.

To obtain the above crystal grain size of 3 nm to 20 nm, Ru [2 nm] is preferably used as the seed layer 12b, or if the $(Ni_xFe_{100-x})_{100-y}Z_y$ (Z=Cr, V, Nb, Hf, Zr, Mo) layer is used as the seed layer 12b, the composition y of the third element Z is preferably about 0% to 30% (inclusive of 0%).

As described above, the seed layer 12b is preferably about 1 nm to 5 nm in thickness, more preferably 1.5 nm to 3 nm. The seed layer 12b, if too thin, does not exhibit the effect of controlling the crystal orientation or the like. The seed layer 12b, if too thick, leads to an increase in serial resistance and sometimes becomes a cause of an irregular surface of an interface of the spin-valve film.

The pinning layer 13 has a function of giving unidirectional anisotropy to a ferromagnetic layer, which is to be the pinned layer 14 formed on the pinning layer 13, to fix magnetization. As a material of the pinning layer 13, usable is an antiferromagnetic material such as IrMn, PtMn, PdPtMn, or RuRhMn. Among them, IrMn is advantageous as a material of a head adapted to high-density recording. A smaller thickness of IrMn can give unidirectional anisotropy than PtMn and thus is suitable for narrowing of gaps necessary for high-density recording.

In order to give sufficiently strong unidirectional anisotropy, the thickness of the pinning layer 13 is appropriately set. The thickness of the pinning layer 13 made of PtMn or PdPtMn is preferably about 8 nm to 20 nm, more preferably 10 nm to 15 nm. The pinning layer 13 made of a smaller thickness of IrMn can give unidirectional anisotropy than the pinning layer 13 made of PtMn and so on, and therefore, a preferable range of its thickness is from 4 nm to 18 nm, more preferably from 5 nm to 15 nm. As a preferable example satisfying the above conditions, IrMn [6 nm] is usable as the pinning layer 13.

As the pinning layer 13, a hard magnetic layer is usable instead of the antiferromagnetic layer. Examples usable as a material of the hard magnetic layer include Co, a Co alloy, CoPt (Co=50% to 85%), $(Co_xPt_{100-x})_{100-y}Cr_y$ (x=50% to 85%, y=0% to 40%), FePt (Pt=40% to 60%), and the like. The hard magnetic layer is relatively smaller in specific resistance than the antiferromagnetic layer and thus has a merit of capable of inhibiting an increase in serial resistance and area resistance RA.

The pinned layer 14 is preferably a synthetic pinned layer comprised of, for example, a pinned layer 141 (for example, $Co_{90}Fe_{10}$ [2 nm]), a magnetic coupling layer 142 (for example, Ru [0.9 nm]), and a pinned layer 143 (for example, $Co_{90}Fe_{10}$ [2 nm]). The pinning layer 13 (for example, IrMn) and the pinned layer 141 immediately thereon are in exchange magnetic coupling to have unidirectional anisotropy. The pinned layers 141, 143 over and under the magnetic coupling layer 142 are in strong magnetic coupling to have antiparallel magnetization directions.

Examples usable as a material of the pinned layer 141 include a $Co_xFe_{100-x}$ alloy (x=0% to 100%), a $Ni_xFe_{100-x}$ alloy (x=0% to 100%), and either of these alloys with a nonmagnetic element being added. As a material of the pinned layer 141, also usable is a single element such as Co, Fe, or Ni, or an alloy thereof.

Preferably, a magnetic thickness (saturation magnetization Bs×thickness t (product Bs·t) of the pinned layer 141 is substantially equal to a magnetic thickness of the pinned layer 143. That is, the magnetic thickness of the pinned layer 143 and the magnetic thickness of the pinned layer 141 preferably match each other. For example, if the pinned layers 141, 143 are made of the same material, it is preferable that the pinned layers 141, 143 are substantially equal in thickness. As another example, if $Fe_{50}Co_{50}$ [2.5 nm] with the bcc structure is used as a material of the pinned layer 143, the magnetic thickness of the pinned layer 143 is 2.2 T×2.5 nm=5.5 Tnm since saturation magnetization of FeCo in a thin film is about 2.2 T. A thickness t of the pinned layer 141 giving a magnetic thickness equal to the magnetic thickness of the pinned layer 143 is 5.5 Tnm/1.8 T=3.0 nm since saturation magnetization of $Co_{90}Fe_{10}$ is about 1.8 T. Therefore, $Co_{90}Fe_{10}$ with an about 3.0 nm thickness is desirably used as a material of the pinned layer 141.

A magnetic layer used as the pinned layer 141 is preferably about 1.5 nm to about 5 nm in thickness. This thickness range is considered preferable in view of strength of unidirectional anisotropic magnetic field given by the pinning layer 13 (for example, IrMn) and strength of magnetic fields of the pinned layer 141 and the pinned layer 143 antiferromagnetically coupled via the magnetic coupling layer 142 (for example, Ru).

The pinning layer 13, if made of a hard magnetic layer, can also serve the function of the pinned layer 141. That is, the pinning layer 13 and the pinned layer 141 may be combined, and as a combined layer, a hard magnetic layer of CoPt or the like with a thickness of about 2 nm to about 5 nm is usable.

The magnetic coupling layer 142 (for example, Ru) has a function of forming a synthetic pinned structure by antiferromagnetically coupling the upper and lower magnetic layers (the pinned layers 141, 143). The Ru layer as the magnetic coupling layer 142 is preferably 0.8 nm to 1 nm in thickness. Any material that can cause sufficient antiferromagnetic coupling between the upper and lower magnetic layers may be used instead of Ru. Instead of the thickness 0.8 nm to 1 nm corresponding to a 2nd peak of RKKY (Ruderman-Kittel-Kasuya-Yoshida) coupling, a thickness 0.3 nm to 0.6 nm corresponding to a 1st peak of the RKKY coupling is usable. A possible example of a material of the magnetic coupling layer 142 here is 0.9 nm Ru capable of stably achieving high-reliability coupling.

As an example of the pinned layer 143, usable is a magnetic layer such as $Co_{90}Fe_{10}$ with a 2 nm thickness. The pinned layer 143 constitutes part of the spin-dependent scattering unit. The pinned layer 143 is a magnetic layer contributing to the magneto-resistive effect, and to obtain a high magneto-resistance ratio, the constituent material and thickness thereof are both important. In particular, a magnetic material positioned on an interface with the external magnetic field sensing layer 15 is especially important because of its contribution to spin-dependent interface scattering.

Instead of the conventional fcc-$Co_{90}Fe_{10}$ used here, bcc-FeCo is also usable as a material of the pinned layer 143. Examples of a bcc-FeCo alloy include $Fe_xCo_{100-x}$ (x=30% to 100%) and $Fe_xCo_{100-x}$ to which an additive element is added. A hcp-cobalt alloy is also usable. Further, as a material of the pinned layer 143, element metal such as Co, Fe, or Ni is usable, and an alloy material containing at least one of these elements is also usable.

Preferably, a total thickness of the pinned layer 143 is 1.5 nm or more. If the pinned layer 143 is a bcc-magnetic layer, a metal material used for the spin-valve film often has the fcc structure or the fct structure. Therefore, there can be a case where only the pinned layer 143 has the bcc structure. In this case, if the pinned layer 143 is too thin, it is difficult to stably maintain the bcc structure, which may cause characteristic instability. Therefore, the pinned layer 143 is preferably 1.5 nm or more in thickness.

However, if the pinned layer 143 is made of Co, a fcc-CoFe alloy, or the like, the thickness of the pinned layer 143 can be reduced to about 1 nm. In this case, the total thickness of the spin-valve film can be reduced, which is advantageous for adaptability to narrowing of gaps. As will be described later, a physical origin of the magneto-resistive effect is different from that of a GMR effect (including both CIP-GMR and CPP-GMR, CIP: Current-in-plane, CPP: Current-perpendicular-to-plane, GMR: Giant magneto-resistance) and a TMR (tunneling magneto-resistance) effect used in a conventional spin-valve film. Therefore, the pinned layer 143, even if ultrathin such as 1 nm, can be sometimes used.

Preferably, the pinned layer 143 is 5 nm or less in thickness. This is intended for obtaining a large pinned/fixed magnetic field.

As the pinned layer 143, also usable is a multilayer in which a magnetic layer (FeCo layer) and a nonmagnetic layer (ultrathin Cu layer) are alternately stacked.

Preferably, the ultrathin Cu layer is 0.1 nm to 0.6 nm in thickness, more preferably 0.2 nm to 0.5 nm. Too large a thickness of the Cu layer sometimes reduces a bulk scattering effect and in addition, weakens the magnetic coupling of the upper and lower magnetic layers via the nonmagnetic Cu layer, so that the pinned layer 14 can exhibit only insufficient characteristic. A preferable thickness of the ultrathin Cu layer is, for example, 0.25 nm.

As a material of the nonmagnetic layer between the magnetic layers, Hf, Zr, Ti, or the like is also usable instead of Cu. In a case where any of these ultrathin nonmagnetic layers is inserted, a thickness per one magnetic layer of FeCo or the like is preferably 0.5 nm to 2 nm, more preferably about 1 nm to about 1.5 nm.

As the pinned layer 143, a layer of an alloy of FeCo and Cu may be used instead of the multilayer in which the FeCo layer and the Cu layer are alternately stacked. An example of such a FeCoCu alloy is $(Fe_xCo_{100-x})_{100-y}Cu_y$ (x=30% to 100%, y=about 3% to about 15%), but other composition range may be used. Here, as an element added to FeCo, other element such as Hf, Zr, or Ti may be used instead of Cu.

As the pinned layer 14, an amorphous metal layer may be used instead of a crystal material. Specifically, CoFeB, CoZrNb, FeZrN, FeAlSi, or the like is usable. One of merits of using the amorphous alloy layer is that less characteristic variation tends to occur among elements because of the following reasons (1) and (2).
(1) No irregularity occurs due to surface irregularity of crystal grains
(2) Even an element size is small, variation in the number of crystal grains in one element need not be taken into consideration.

If the hard magnetic layer is used as the pinning layer 13, the hard magnetic layer can sometimes serve as all the four layers of the pinning layer 13/the pinned layer 141/the magnetic coupling layer 142/the pinned layer 143. If a hard magnetic layer of CoPt or the like is used as the pinning layer 13 in this case, the hard magnetic layer serving as these four layers can be formed to have a 2 nm to 4 nm thickness, so that the total film thickness can be greatly reduced.

The external magnetic field sensing layer 15 is disposed on the pinned layer 14. The external magnetic field sensing layer 15 has a function corresponding to the function of the free layer 96 of the spin-valve film 90. In the conventional spin-valve film 90, the pinned layer 94 and the free layer 96 could never be stacked with no spacer layer 95 interposed therebetween. The magneto-resistive film 10 can exhibit a magneto-resistive effect without using the spacer layer 95.

One of merits of the structure using no spacer layer is that there is no influence of spin flip of conduction electrons in the spacer layer as described above. Since the spin-flip phenomenon need not be taken into consideration, large values can be easily obtained for resistance variation and a MR ratio, easily realizing adaptability to higher density.

Moreover, since the spacer layer 95 is not necessary, the total thickness of the magneto-resistive film 10 can be reduced. It is possible to form a magneto-resistive element having a thickness small enough to be adapted to narrower gaps.

As the external magnetic field sensing layer 15, usable is a structure including an ultrathin oxide layer, nitride layer, or oxynitride layer. As a base material to form oxide, nitride, oxynitride, or the like, usable is Ti, V, Cr, Mn, Fe, Co, Ni, Cu, Zr, Nb, Mo, Ru, Rh, Pd, W, Ta, or the like.

The magneto-resistive film 10 is characterized in that the external magnetic field sensing layer 15 is directly formed on the pinned layer 14 without any spacer layer therebetween. As will be described in detail later, in order to sense an external magnetic field, the external magnetic field sensing layer 15 needs to interact with the external magnetic field (for example, the external magnetic field sensing layer 15 has weak magnetism). For this purpose, an oxide layer, a nitride layer, or an oxynitride layer containing, as a major component, for example, Pd or 3d nonmagnetic transitional metal element such as Ti, V, Cr, or Mn is preferably used as the external magnetic field sensing layer 15. Further, any of these oxide layer, nitride layer, and oxynitride layer containing an element such as Fe, Co, or Ni that is a single element capable of exhibiting magnetism is also preferable as the external magnetic field sensing layer 15. Further, as the external magnetic field sensing layer 15, an ultrathin oxide layer, nitride layer, or oxynitride layer of ultrathin Zr, Mo, Ru, Rh, W, Ta, Fe, Co, Ni, Cu, Nb, or Pd is usable, and alternatively, such an oxide layer, nitride layer, or oxynitride layer containing Fe, Co, or Ni is also usable.

Preferably, a thickness range of the external magnetic field sensing layer 15 is from 0.5 nm to 3 nm, more preferably from 1 nm to 2.5 nm. The external magnetic field sensing layer 15, if too thin, is difficult to exhibit an external magnetic field sensing function. On the other hand, the external magnetic field sensing layer 15, if too thick, sometimes exhibits a weakened external magnetic field sensing function, which is not desirable.

The external magnetic field sensing layer 15 can sense an external magnetic field on the order of several tens to hundreds [Oe]. That is, depending on the direction of the external magnetic field, the magneto-resistive film 10 comes to have a higher resistance or a lower resistance. One desirable example of the external magnetic field sensing layer 15 is a TiOx-Co or —Fe layer in which TiOx is a basic material and Fe or Co element is contained. As will be described later, the magneto-resistive film 10 with this structure comes to have a lower resistance when applied with a positive magnetic field, whereas coming to have a higher resistance when applied with a negative magnetic field of about 100 [Oe].

The external magnetic field sensing layer 15 may contain Fe, Co, Ni, Ti, Hf, Mg, Zr, V, Mo, Si, Cr, Nb, Ta, W, B, C, V, or the like as an additive element. An addition amount of any of these additive elements can be appropriately changed within a range from 0% to 50%.

Besides the aforesaid oxide, nitride, or oxynitride, a metal material that contains, as a major component, Ti, V, Cr, Mn, or Pd is usable as a material of the external magnetic field sensing layer 15, or a material that contains an element such as Fe, Co, Ni, or the like in addition to any of the above elements may be used. These materials easily exhibit weak magnetism. In particular, in the structure where the ultrathin film is sandwiched by the upper and lower ferromagnetic materials as in this embodiment, magnetism is easily exhibited. Such a metal material need not be oxide, nitride, or oxynitride, but may be used as it is.

The pinned layer 16 is disposed on the external magnetic field sensing layer 15. The magnetization direction of the pinned layer 16 is fixed and makes substantially no change depending on an external magnetic field. In order to fix the magnetization direction of the pinned layer 16, the pinned layer 16 preferably has the pinning layer 17 thereon, similarly to the pinned layer 14.

However, the magneto-resistive effect is sometimes exhibited even if the pinning layer 17 is not formed on the pinned layer 16. For example, if the external magnetic field sensing layer 15 is as thin as about 1.5 nm to about 2 nm or less, the magnetization direction of the pinned layer 16 may possibly be fixed even without the pinning layer 17. That is, the pinned layer 14 whose magnetization is fixed by the pinning layer 13 is sometimes magnetically coupled to the pinned layer 16 via the external magnetic field sensing layer 15, resulting in the fixation of the magnetization direction of the pinned layer 16. It has not been known in detail by what mechanism the pinned layers 14, 16 come in strong magnetic coupling via the external magnetic field sensing layer 15 when the external magnetic field sensing layer 15 senses the external magnetic field.

The same material and thickness as those of the pinned layer 14 are usable for the pinned layer 16. For example, usable is: a single element of Co, Fe or Ni; a CoFe alloy; a NiFe alloy; a NiCo alloy; or an alloy material containing Co, Fe, or Ni. A fcc-CoFe alloy, a bcc-FeCo alloy, or the like is also desirable as the material of the pinned layer 16. As the pinned layer 16, a $Co_{90}Fe_{10}$ layer of 2 nm is usable.

The pinned layer 16 may be an amorphous metal layer instead of a crystal material layer, similarly to the pinned layer 14. Specifically, CoFeB, CoZrNb, FeZrN, FeAlSi or the like is usable. One of merits of using an amorphous alloy layer is that characteristic variation among elements does not tend to occur because of the following reasons (1) and (2).
(1) Irregularity ascribable to surface irregularity of crystal grains does not occur.
(2) Even if an element size is small, a problem of variation in the number of crystal grains in one element need not be taken into consideration.

As described above, preferably, the pinning layer 17 is disposed on the pinned layer 16 to exhibit a sufficient pinning function. In this case, the pinned layer 16 may have the same structure as that of the pinned layer 14. For example, the pinned layer 16 may have a synthetic pinned structure using Ru and so on. Further, for pinning the pinned layer 16, an antiferromagnetic layer of IrMn, PtMn, or the like and a hard layer of CoPt, CoPtCr or the like are usable. Specifically, the pinned layer 16 can have either of the following structures (1) and (2).
(1) CoFe [2 nm]/Ru [0.9 nm]/CoFe [2 nm]/IrMn [6 nm]
(2) bcc-FeCo [2.5 nm]/Ru [0.9 nm]/CoFe [3.0 nm]/IrMn [6 nm]

For pinning the pinned layer 16, a hard magnetic layer as is used for pinning the pinned layer 14 is also usable as the pinning layer 17. In this case, the pinned layer 16 may be a multilayer of a pinned layer 161/a magnetic coupling layer 162/a pinned layer 163 and can have a structure such as CoFe [2 nm]/Ru [0.9 nm]/CoPt [3.2 nm]. At this time, hard magnetic layers of CoPt are usable instead of the antiferromagnetic layer (the pinning layer 17) and the magnetic layer (the pinned layer 163) in contact with the antiferromagnetic layer. Further, it is also possible not to dispose the magnetic coupling layer 162 (Ru [0.9 nm]) and to use CoPt [3 nm] instead of CoFe [2 nm]/Ru [0.9 nm]/CoPt [3.2 nm] as a material of the pinned layer 16.

The cap layer 18 is disposed on the pinning layer 17 or on the pinned layer 16. As the cap layer 18, a Cu/Ta layer, a Ru/Ta layer, a Ta layer, or the like is usable. In a case where the cap layer 18 is disposed directly on the pinned layer 16 without providing the pinning layer 17, a Cu layer or a Ru layer is preferably provided on the magnetic layer (the pinned layer 16). A thickness of Cu or Ru at this time is preferably about 0 nm to about 2 m. As the material of the cap layer 18, usable is Ta, Ti, Zr, W, Nb, Cr, Mo, V, or Hf, or an alloy material containing any of these elements, or a conductive oxide or nitride layer containing any of these elements. A thickness thereof is preferably about 1 nm to about 5 nm.

A. Mechanism (1) of Occurrence of Magneto-Resistive Effect

A physical mechanism of how the magneto-resistive effect occurs in the magneto-resistive film 10 will be described. However, at present, some part of the physical mechanism of how the magneto-resistive effect occurs is not completely known.

Measurement of R–H (resistance-magnetic field) loop and M–H (magnetization-magnetic field) loop have revealed that the magnetization direction of the pinned layer 16 is substantially fixed even without the pinning layer 17 when the magneto-resistive effect occurs. That is, the magnetization direction of the upper magnetic layer (the pinned layer 16) is fixed via the pinning layer 13, the pinned layer 14, and the external magnetic field sensing layer 15.

The external magnetic field sensing layer 15 uses a material generally considered nonmagnetic such as TiOx. However, because of the following reasons 1) to 3), there is a possibility that the external magnetic field sensing layer 15 exhibits weak magnetism.

Reason 1) The external magnetic field sensing layer 15 has a very small thickness of 1.2 nm and the pinned layers 14, 16 disposed on the upper and lower sides thereof are magnetic layers. Therefore, the external magnetic field sensing layer 15 is influenced by the pinned layers 14, 16 because of exchange length and thus may possibly exhibit magnetism.

Reason 2) The 3d transitional metal element such as Ti contained in the external magnetic field sensing layer 15 may possibly cause the external magnetic field sensing layer 15 to exhibit magnetism.

Reason 3) The external magnetic field sensing layer 15 may possibly contain a magnetic element because a certain amount of a magnetic element such as Co or Fe diffuses from the pinned layers 14, 16.

When exhibiting magnetism, the external magnetic field sensing layer 15 functions as a free layer whose magnetization direction changes depending on the external magnetic field. It is thought that the magneto-resistive film 10 has a lower resistance when the external magnetic field sensing layer 15 has a magnetization direction parallel to the magnetization direction of the upper and lower pinned layers 14, 16, while it has a higher resistance when the external magnetic field sensing layer 15 has an antiparallel magnetization direction. For example, the magnetization direction of the external magnetic field sensing layer 15 is substantially orthogonal to the magnetization direction of the pinned layers 14, 16 when there is no application of a magnetic field.

However, with magnetization measurement accuracy currently achieved by a VSM (vibrating sample magnetometer), the magnetization of a TiOx layer has not been observed. The magnetization of the TiOx layer, if any, is thought to be very small.

Besides the aforesaid oxide, nitride, or oxynitride layer, a metal material containing, as a major component, Ti, V, Cr, Mn, or Pd easily exhibiting weak magnetism may be used. Other element may be added to the metal material containing any of these elements as a major component. The major component here refers to a component whose content is 50 atomic % or more. This definition also applies to other descriptions. When any of these elements is used, if thickness is as small as about 1 nm to about 3 nm, weak magnetism, that is, magnetization can also occur due to the influence from the upper and lower ferromagnetic materials (the pinned layers 14, 16).

B. Mechanism (2) of Occurrence of Magneto-Resistive Effect

As the mechanism of the occurrence of the magneto-resistive effect (2), conceivable is a case where the external magnetic field sensing layer 15 has no magnetization (therefore, there exists no change in magnetization depending on an external magnetic field) but senses the external magnetic field. A physical mechanism in this case will be described.

There can be a case where the external magnetic field sensing layer 15 containing TiOx or the like as a major component senses an external magnetic field without having a net moment itself inducing external magnetization. Conduction electrons flow thereto/therefrom between the pinned layers 14, 16. When the conduction electrons pass through the external magnetic field sensing layer 15, spin-flip of the conduction electrons is caused at one time and is not caused at some other time by the external magnetic field. Depending on the direction of the spin at this time, resistance changes in an interface between either of the pinned layers 14, 16 to which the conduction electrons flow and the external magnetic field sensing layer 15.

Figure 4A:
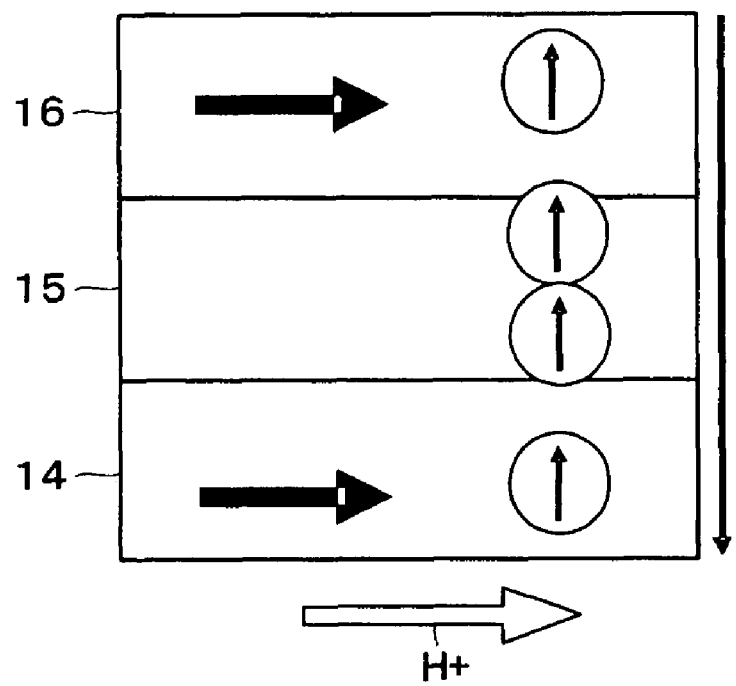
FIG. 4A is a schematic view showing a mechanism of the occurrence of a magneto-resistive effect.
Figure 4B:
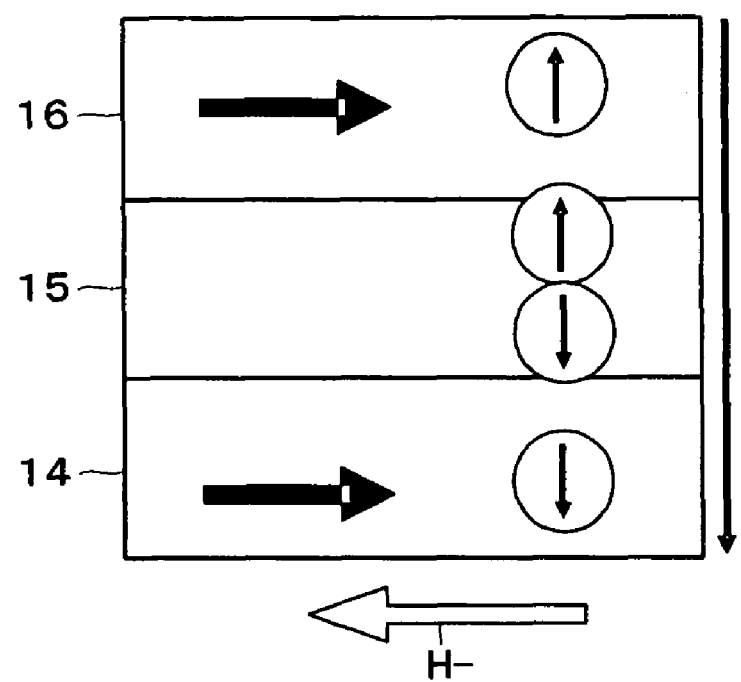
FIG. 4B is a schematic view showing the mechanism of the occurrence of the magneto-resistive effect.

FIG. 4A and FIG. 4B show the mechanism (2) of the occurrence of the magneto-resistive effect.

Conduction electrons are flowing from the pinned layer 16 to the pinned layer 14. In FIG. 4A, an external magnetic field H+ in a positive direction parallel to the magnetization direction of the pinned layers 14, 16 is applied and the spin of the conduction electrons is not flipped. In this state, the magneto-resistive film has a lower resistance. On the other hand, in FIG. 4B, an external magnetic field H− in a negative direction antiparallel to the magnetization direction of the pinned layers 14, 16 is applied and the spin of the conduction electrons is flipped in the external magnetic field sensing layer 15. In this state, the magneto-resistive film has a higher resistance.

Here, the magneto-resistive film has a lower resistance when the magnetic field H+ parallel to the magnetization direction of the pinned layers 14, 16 is applied, and has a higher resistance when the antiparallel magnetic field H− is applied. However, depending on the selection of materials of the external magnetic field sensing layer 15 and the pinned layers 14, 16, this relation may possibly be reversed. That is, in some case, the resistance becomes higher when the magnetic field H+ parallel to the magnetization direction of the pinned layer 14, 16 is applied, and becomes lower when the antiparallel magnetic field H− is applied.

Normally, the spin of the conduction electrons is not directly flipped by the external magnetic field. It is thought that the inside of the external magnetic field sensing layer 15 is in a state where the direct flip of the spin of the conduction electrons is easily caused by the external magnetic field. Details of this micro mechanism are not known, but it is thought that the external magnetic field sensing layer 15 is preferably on a boundary between a state with a net moment and a state without a net moment. From this viewpoint, as the external magnetic field sensing layer 15, it is desirable to use an oxide, nitride, or oxynitride layer of 3d transitional metal easily exhibiting magnetism.

Further, a metal material containing, as a major component, an element metal of Ti, Cr, V, Mn, or Pd easily exhibiting magnetism is usable as a material of the external magnetic field sensing layer 15.

C. Mechanism (3) of Occurrence of Magneto-Resistive Effect

Even if the external magnetic field sensing layer 15 itself does not have magnetization, it can be thought that the upper and lower magnetic layers (the pinned layers 14, 16) are in strong magnetic coupling via the external magnetic field sensing layer 15 (self-coupling). There is a possibility that such a phenomenon may occur since localized electrons in the external magnetic field sensing layer 15 contributing to the magnetic coupling exist separately from conduction electrons causing the spin-flip by the external magnetic field.

In this case, only one of the pinning layers 13, 17 corresponding to the pinned layers 14, 16 needs to be disposed, and the other of the pinning layers 13, 17 can be omitted. One of the pinned layers 14, 16 with no pinning layer disposed thereon is self-coupled to the other of the pinned layers 14, 16 owing to the magnetic coupling via the external magnetic field sensing layer 15.

Since one of the pinning layers 13, 17 can be omitted, the total thickness of the magneto-resistive film 10 can be reduced.

Further, the self-coupling effect produces an advantage that a plurality of the external magnetic field sensing layers 15 can be utilized even when only one of the pinning layers 13, 17 is disposed. Specifically, the plural magnetic layers are magnetically coupled via the plural external magnetic field sensing layers 15 and all of these magnetic layers can be utilized as pinned layers. Usability of the plural external magnetic field sensing layers 15 means that there exist a plurality of the spin-dependent scattering units, so that a higher magneto-resistance ratio can be expected.

(Method of Manufacturing Magneto-Resistive Element)

A method of manufacturing a magneto-resistive element will be described.

Figure 5:
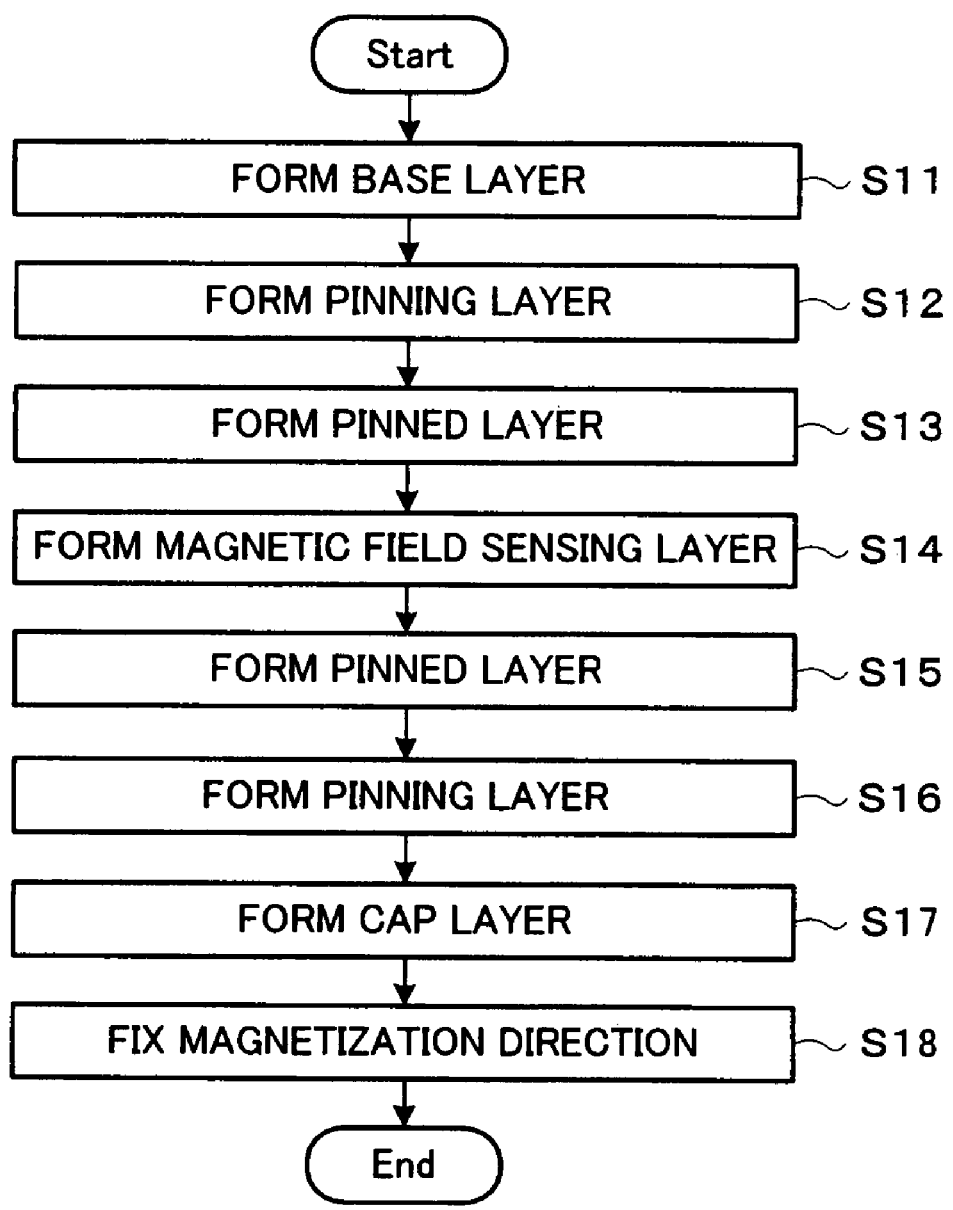
FIG. 5 is a flowchart showing an example of the procedure for manufacturing the magneto-resistive element.

As shown in the flowchart in FIG. 5, the base layer 12 to the cap layer 18 are stacked in sequence on a substrate. After these layers are stacked, the magnetization directions of the pinned layers 14, 16 are fixed. The magnetization directions can be fixed by, for example, application of a magnetic field during heat treatment. As will be described later, when hard magnetic layers are used as the pinning layers 13, 17, it is possible to fix the magnetization of the pinned layers 14, 16 by applying a magnetic field on the order of about 10 kOe to about 15 kOe for several ten seconds to several minutes.

For forming the external magnetic field sensing layer 15, the following two kinds of methods (1) and (2) are applicable.

(1) After a film of a metal material being a base material not yet subjected to oxidation, nitridation, or oxynitridation is formed, a surface of the metal material is oxidized. To form the film of the metal material, sputtering, deposition, MBE, ion beam sputtering, CVD, or the like is usable.

(2) An oxide layer, a nitride layer, or an oxynitride layer is directly formed. To form this layer, sputtering, deposition, MBE, ion beam sputtering, CVD, or the like is usable.

Here, as the surface oxidation in (1), natural oxidation or energy-assisted oxidation is usable.

1) In the natural oxidation, after the film of the base material metal is formed, the surface of the film is exposed to oxygen- or nitrogen-containing gas. Examples of the oxygen- or nitrogen-containing gas are oxygen gas, nitrogen gas, mixed gas of oxygen and nitrogen, mixed gas of oxygen and rare gas, mixed gas of nitrogen and rare gas, and mixed gas of oxygen, nitrogen, and rare gas.

2) In the energy-assisted oxidation, the metal material is oxidized, nitrided, or oxynitrided with oxygen- or nitrogen-containing gas while the film surface is irradiated with ion beams, plasma, or the like. The energy-assisted oxidation also includes a thermal oxidation method using thermal energy by heating a substrate. Further, the combination of the ion beam or plasma irradiation and the heating may be used.

Next, a film forming apparatus used to manufacture the magneto-resistive element will be described.

Figure 6:
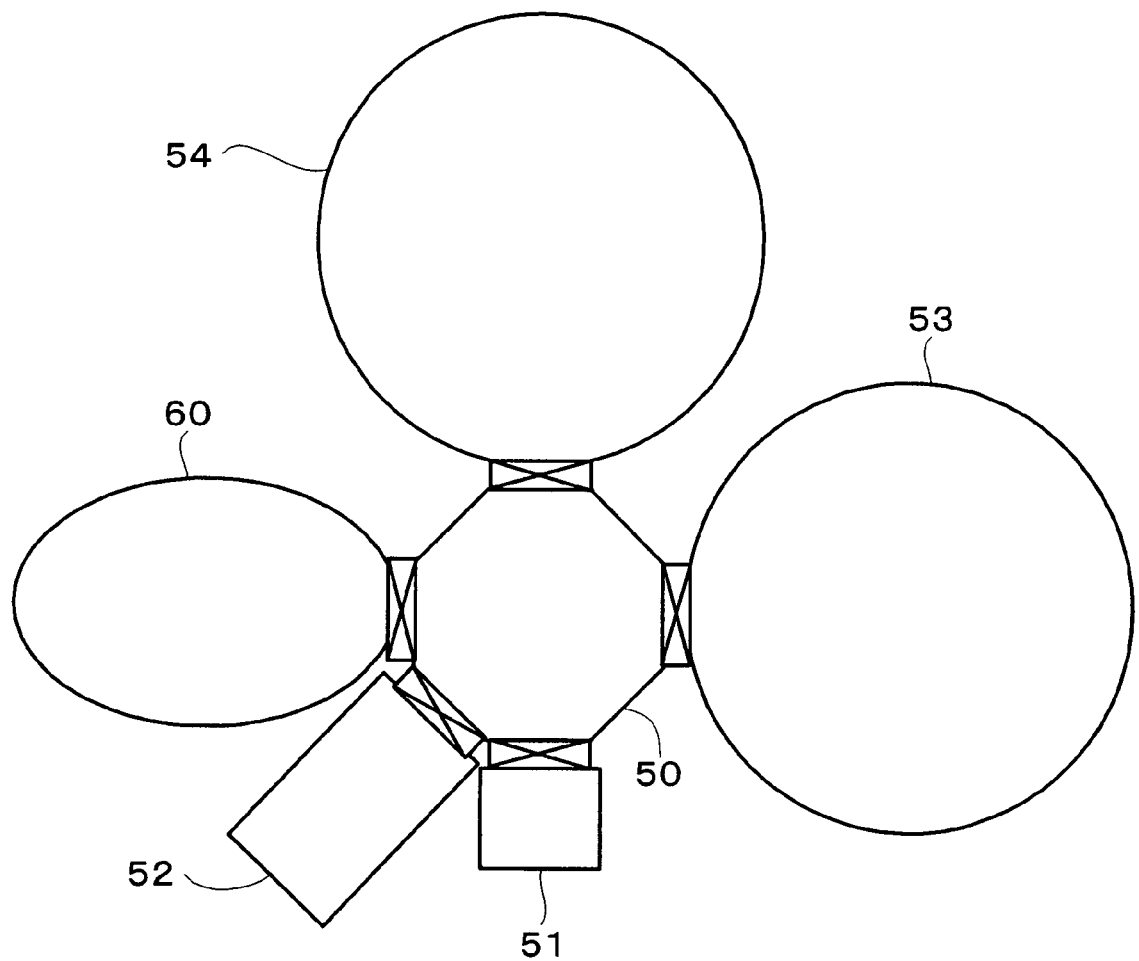
FIG. 6 is a schematic view showing an overview of a film forming apparatus used to manufacture the magneto-resistive element.

As shown in FIG. 6, the film forming apparatus includes a load lock chamber 51, a pre-cleaning chamber 52, a first metal deposition chamber (MC1) 53, a second metal deposition chamber (MC2) 54, and an oxide/nitride layer forming chamber (OC) 60, which are disposed around a transfer chamber (TC) 50 via gate vales respectively. In this film forming apparatus, the substrate can be transferred in a vacuum atmosphere between the chambers connected via the gate valve, so that a surface of the substrate is kept clean. An ultimate vacuum degree of each of the chambers is desirably on the order of $10^{-8}$ Torr to $10^{-10}$ Torr. A desirable vacuum degree is typically on the order of $10^{-9}$ Torr from a practical viewpoint.

The metal deposition chambers 53, 54 have multi-targets (5 to 10). Examples of a film formation method are a sputtering method such as DC magnetron sputtering or RF magnetron sputtering, an ion beam sputtering method, a deposition method, a CVD (Chemical Vapor Deposition) method, a MBE (Molecular Beam Epitaxy) method, and the like.

The external magnetic field sensing layer 15 is formed of one of an oxide layer, a nitride layer, and an oxynitride layer and therefore is formed in the oxide/nitride layer forming chamber 60. As described above, the external magnetic field sensing layer 15 may be formed by the surface oxidation method, or the oxide layer/nitride layer/oxynitride layer may be directly formed.

EXAMPLE

Hereinafter, an example of the present invention will be described. The structure of a magneto-resistive film 10 according to the example has the following structure.
Lower electrode 11
Base layer 12 (buffer layer 12a/seed layer 12b): Ta [5 nm]/Ru [2 nm]
Pinning layer 13: PtMn [15 nm]
Pinned layer 14 (pinned layer 141/magnetic coupling layer 142/pinned layer 143): CoFe [3 nm]/Ru [0.9 nm]/CoFe [3 nm]
External magnetic field sensing layer 15: TiOx [2 nm]
Pinned layer 16 (pinned layer 161/magnetic coupling layer 162/pinned layer 163): CoFe [3 nm]/Ru [0.9 nm]/CoFe [3 nm]
Pinning layer 17: PtMn [15 nm]
Cap layer 18: Ta [5 nm]

After a spin-valve film was formed, 290-degree heat treatment was performed in a 10 kOe magnetic field for 4 hours in order to realize improved crystallinity and regular PtMn. Thereafter, the element size of the spin-valve film was defined by a lithography process, and the upper electrode 20 was formed.

The magnetization directions of the upper and lower CoFe layers (the pinned layers 143 and the pinned layers 161) in contact with TiOx (the external magnetic field sensing layer 15) are fixed in the same direction. Further, these CoFe layers (the pinned layer 143 and the pinned layer 161) are in strong magnetic coupling to the CoFe layers (the pinned layer 141 and the pinned layer 163), which are disposed on the upper and lower outer sides thereof, via Ru (the magnetic coupling layers 142, 162) in an antiferromagnetic (antiparallel) manner.

These CoFe layers (the pinned layer 141 and the pinned layer 163) are pinned by the IrMn layers (the pinning layer 13, 17) disposed on outer sides thereof. The pinning direction is regulated by a value of the aforesaid magnetic field applied during the magnetic heat treatment.

Here, as the pinning layer 13, an antiferromagnetic layer is used. Instead, a hard magnetic layer is usable as the pinning layer 13. In this case, it is possible to magnetize the pinning layer 13 not by applying the magnetic field during the heat treatment but by applying a ferromagnetic field of about 10 to about 15 [kOe] at room temperature. In the case where the hard magnetic layer is used for pinning, heat treatment for improving crystallinity is preferably performed after the spin-valve film is formed.

As will be described later, it is also possible to use both the antiferromagnetic layer and the hard magnetic layer to separately pin the upper and lower pinned layers 14, 16. In this case, the antiferromagnetic layer and the hard magnetic layer can be separately magnetized. In the pinning by the antiferromagnetic layer, the magnetization direction is regulated by the direction of the magnetic field applied during the magnetic heat treatment. On the other hand, in the pinning by the hard magnetic layer, the pinned layer can be magnetized in any direction by a magnetization process of 10 kOe to 15 kOe after the magnetic heat treatment, irrespective of the magnetization direction fixed by the antiferromagnetic layer. As an example, it is possible to fix the magnetization of the hard magnetic layer in a direction antiparallel to the magnetization direction fixed by the antiferromagnetic layer.

The magneto-resistive film 10 of this example had a lower resistance when applied with a magnetic field in the positive direction (the magnetization direction parallel to the magnetization direction of the pinned layers 161, 143), and had a higher resistance when applied with a magnetic field of about 100 [Oe] in the negative direction (the magnetization direction antiparallel to the magnetization direction of the pinned layers 161, 143). In the magneto-resistive film 10 of this example, an area resistance RA was 4000 [mΩμm$^2$] and a magneto-resistance ratio MR was 16%. This value of the area resistance RA is rather large, but can be reduced by material and process optimization.

Figure 7:
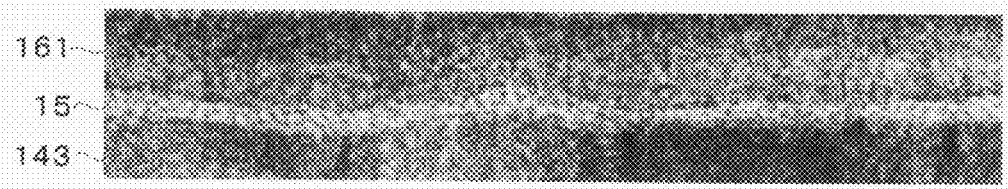
FIG. 7 is a cross-section TEM photograph of a magneto-resistive film according to an example.

FIG. 7 is a cross-section TEM photograph of a magneto-resistive film according to an example. As is seen in FIG. 7, the TiOx layer (the external magnetic field sensing layer 15) is formed along crystal grains of the CoFe layer (the pinned layer 143). This TiOx layer is continuous and does not have any pinhole. Since the external magnetic field sensing layer 15 is thus continuous, variation in each element is reduced even if the element size is as microscopic as 50 nm or less.

How the characteristic of the magneto-resistive film 10 changes depending on fabrication conditions will be described.

Figure 8:
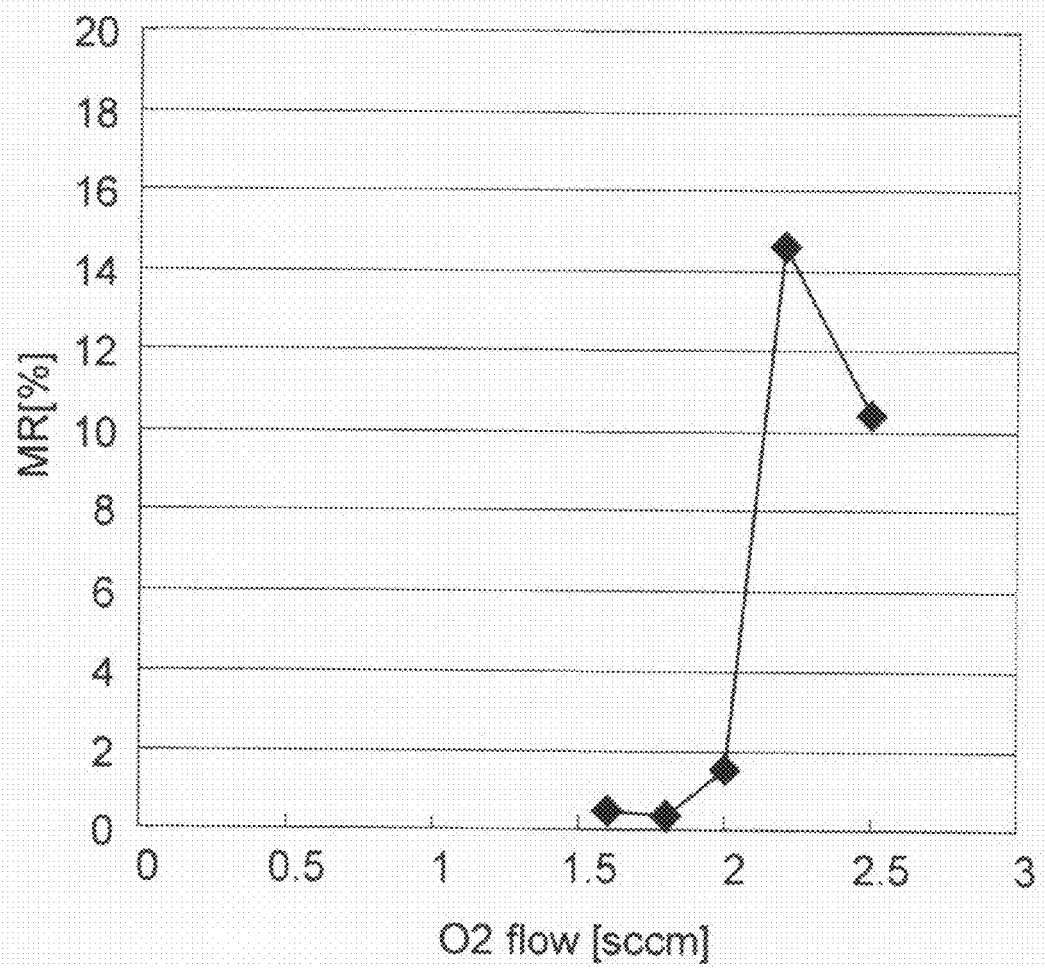
FIG. 8 is a graph showing the correlation between an oxygen flow rate and a magneto-resistance ratio in forming the magneto-resistive film.
Figure 9:
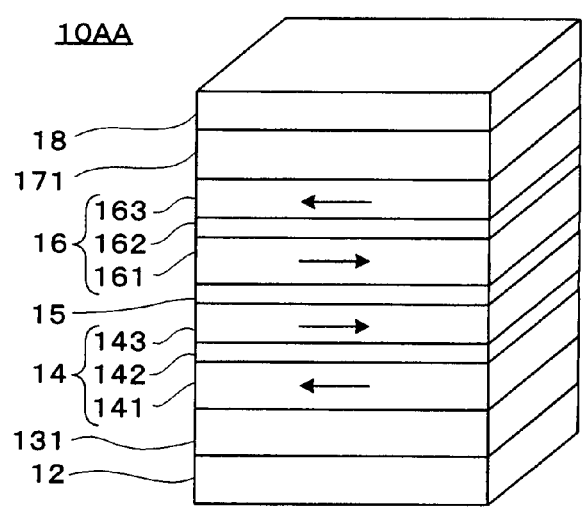
FIG. 9 is a perspective view showing a structural example of a magneto-resistive film in which upper and lower pinned layers both have a synthetic pinned structure.
Figure 10:
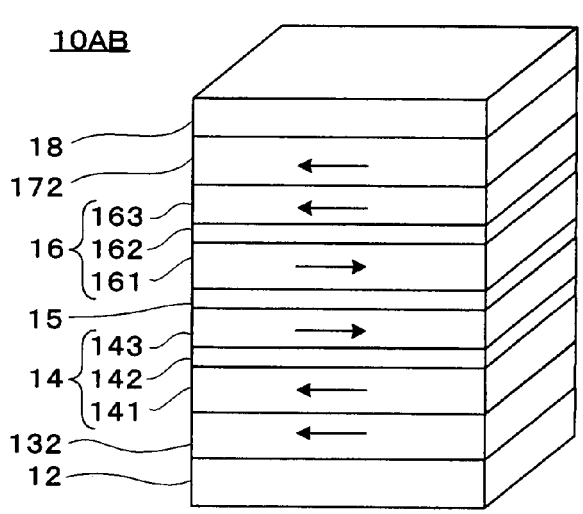
FIG. 10 is a perspective view showing a structural example of a magneto-resistive film in which upper and lower pinned layers both have a synthetic pinned structure.
Figure 11:
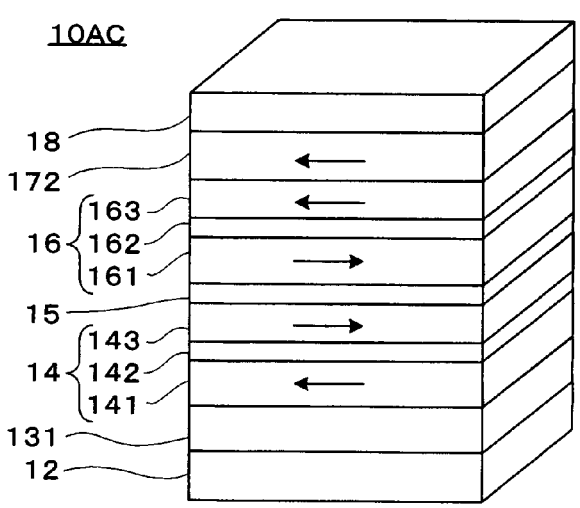
FIG. 11 is a perspective view showing a structural example of a magneto-resistive film in which upper and lower pinned layers both have a synthetic pinned structure.
Figure 12:
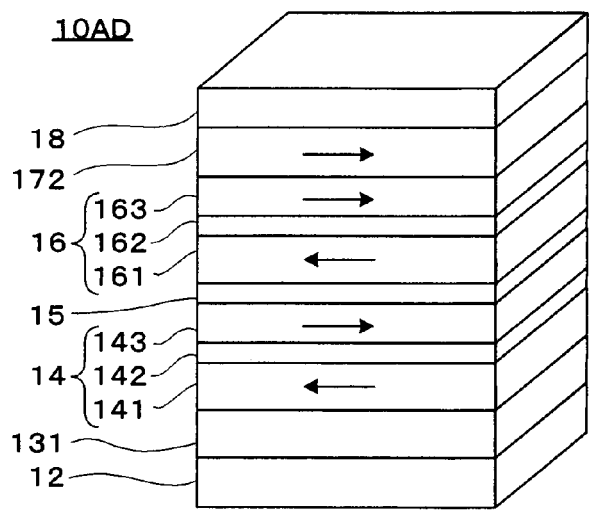
FIG. 12 is a perspective view showing a structural example of a magneto-resistive film in which upper and lower pinned layers both have a synthetic pinned structure.
Figure 13:
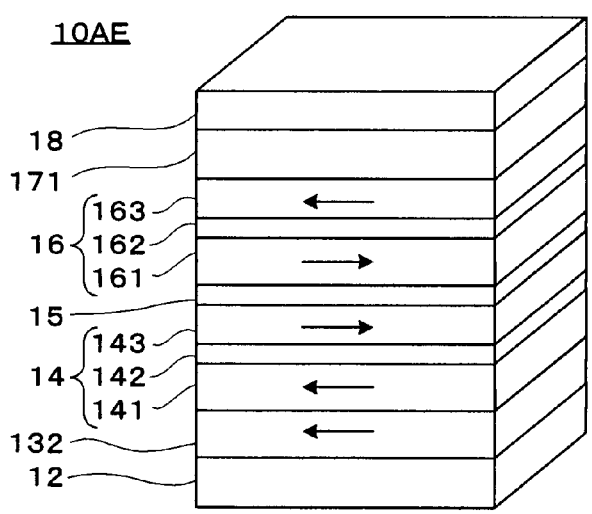
FIG. 13 is a perspective view showing a structural example of a magneto-resistive film in which upper and lower pinned layers both have a synthetic pinned structure.
Figure 14:
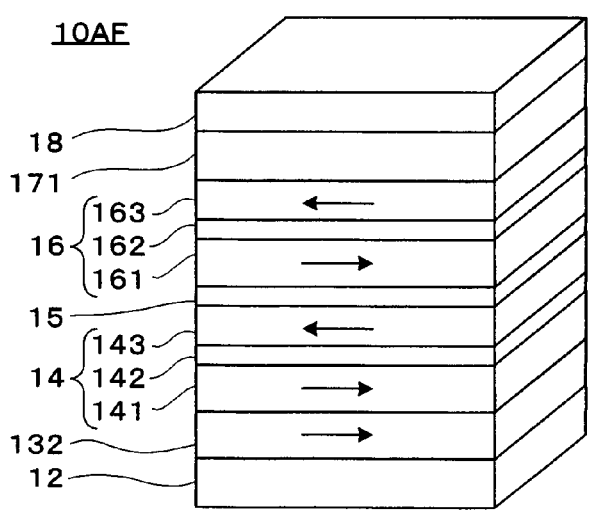
FIG. 14 is a perspective view showing a structural example of a magneto-resistive film in which upper and lower pinned layers both have a synthetic pinned structure.
Figure 15:
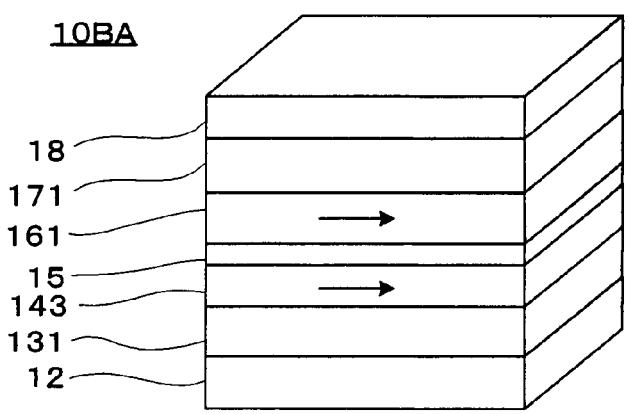
FIG. 15 is a perspective view showing a structural example of a magneto-resistive film in which upper and lower pinned layers both have a single-layer pinned structure.
Figure 16:
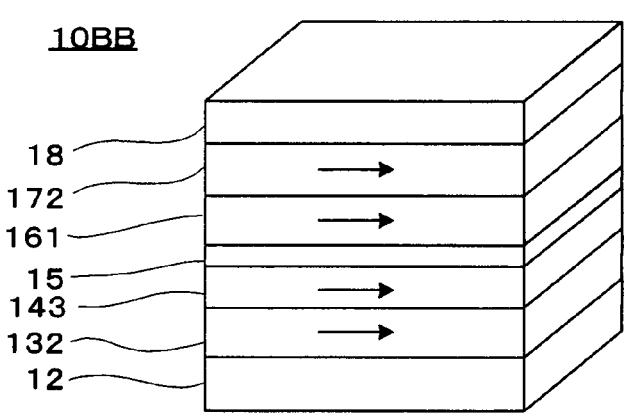
FIG. 16 is a perspective view showing a structural example of a magneto-resistive film in which upper and lower pinned layers both have a single-layer pinned structure.
Figure 17:
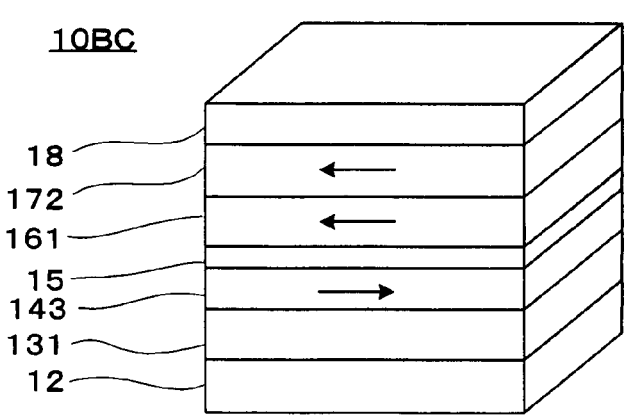
FIG. 17 is a perspective view showing a structural example of a magneto-resistive film in which upper and lower pinned layers both have a single-layer pinned structure.
Figure 18:
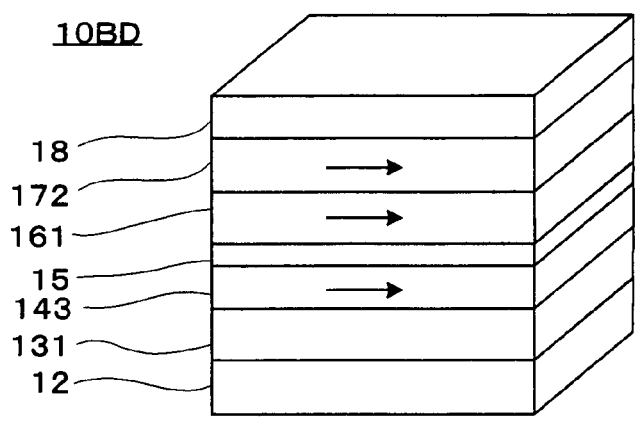
FIG. 18 is a perspective view showing a structural example of a magneto-resistive film in which upper and lower pinned layers both have a single-layer pinned structure.
Figure 19:
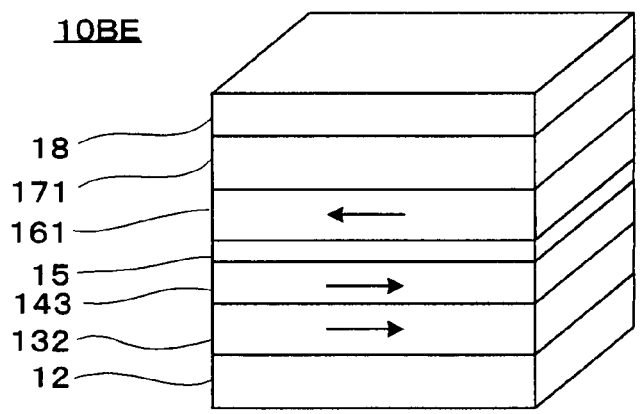
FIG. 19 is a perspective view showing a structural example of a magneto-resistive film in which upper and lower pinned layers both have a single-layer pinned structure.
Figure 20:
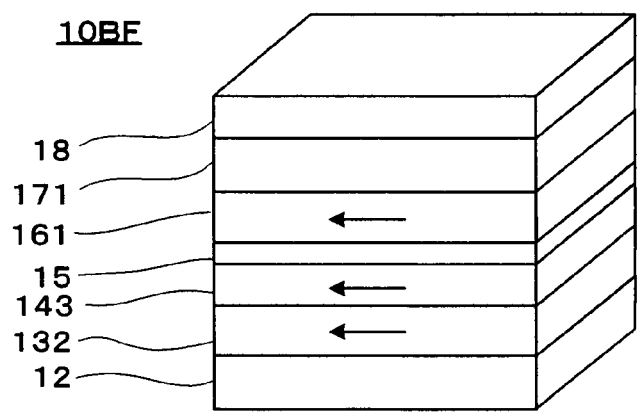
FIG. 20 is a perspective view showing a structural example of a magneto-resistive film in which upper and lower pinned layers both have a single-layer pinned structure.
Figure 21:
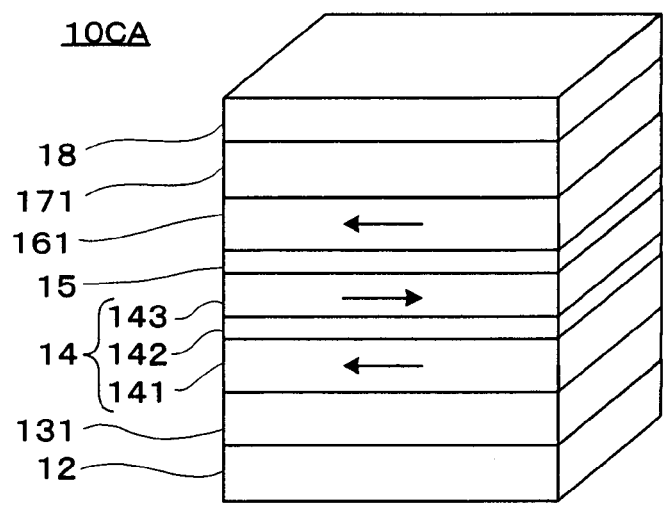
FIG. 21 is a perspective view showing a structural example of a magneto-resistive film in which one of upper and lower pinned layers has a synthetic pinned structure and the other has a single-layer pinned structure.
Figure 22:
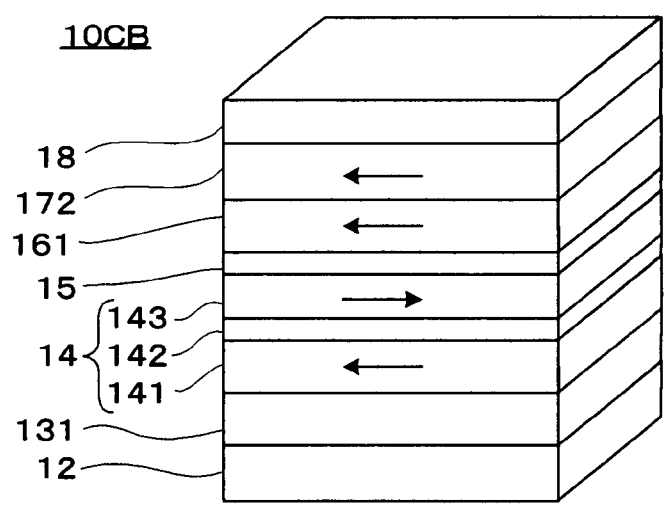
FIG. 22 is a perspective view showing a structural example of a magneto-resistive film in which one of upper and lower pinned layers has a synthetic pinned structure and the other has a single-layer pinned structure.
Figure 23:
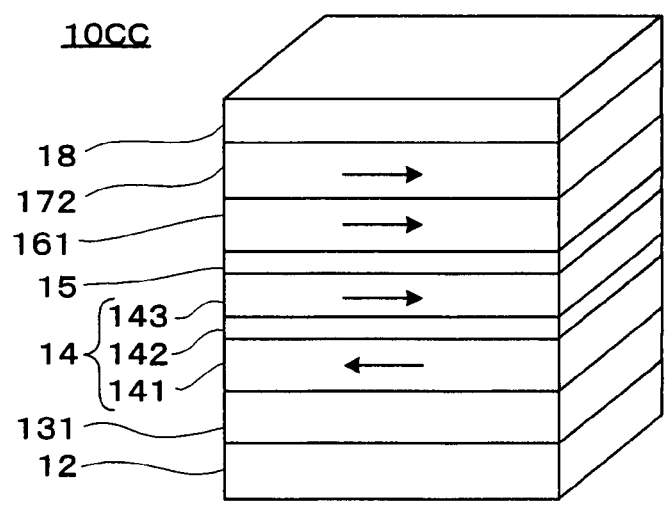
FIG. 23 is a perspective view showing a structural example of a magneto-resistive film in which one of upper and lower pinned layers has a synthetic pinned structure and the other has a single-layer pinned structure.
Figure 24:
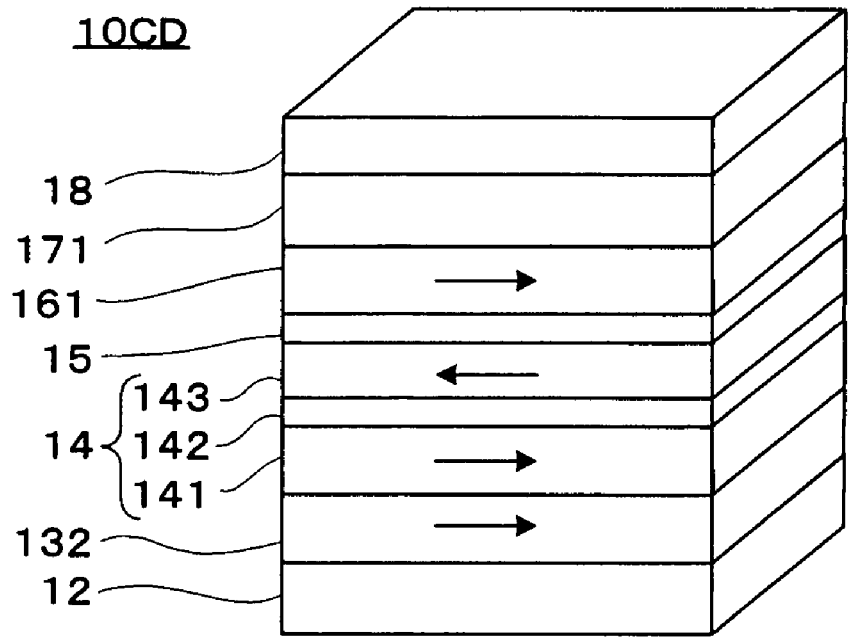
FIG. 24 is a perspective view showing a structural example of a magneto-resistive film in which one of upper and lower pinned layers has a synthetic pinned structure and the other has a single-layer pinned structure.
Figure 25:
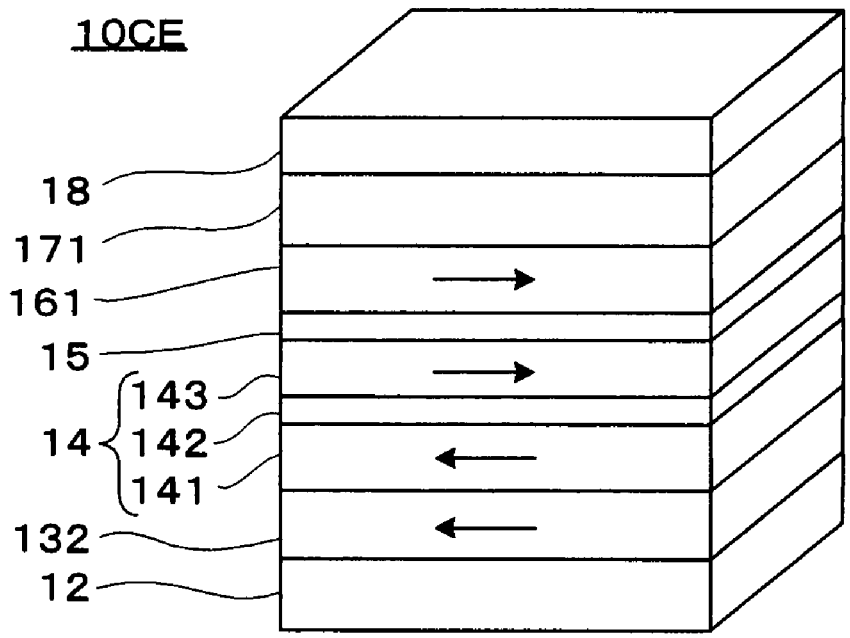
FIG. 25 is a perspective view showing a structural example of a magneto-resistive film in which one of upper and lower pinned layers has a synthetic pinned structure and the other has a single-layer pinned structure.
Figure 26:
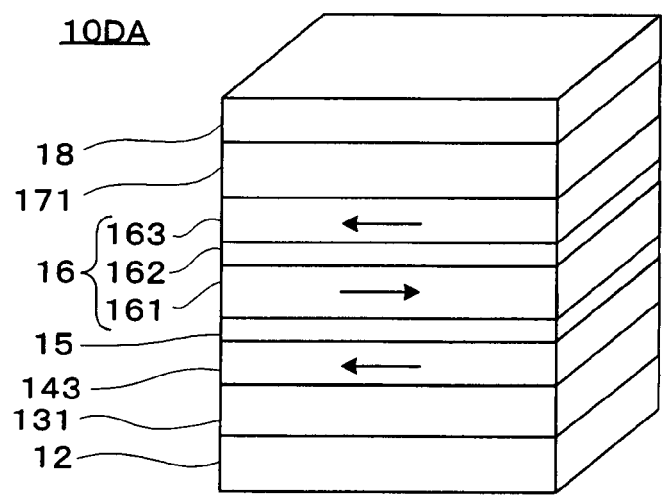
FIG. 26 is a perspective view showing a structural example of a magneto-resistive film in which one of upper and lower pinned layers has a synthetic pinned structure and the other has a single-layer pinned structure.
Figure 27:
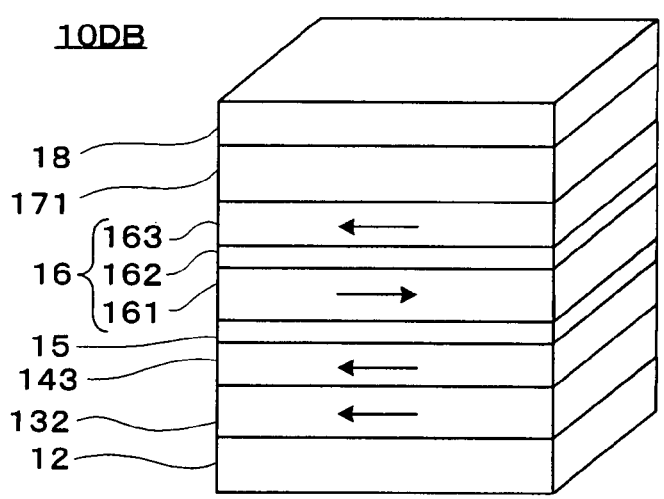
FIG. 27 is a perspective view showing a structural example of a magneto-resistive film in which one of upper and lower pinned layers has a synthetic pinned structure and the other has a single-layer pinned structure.
Figure 28:
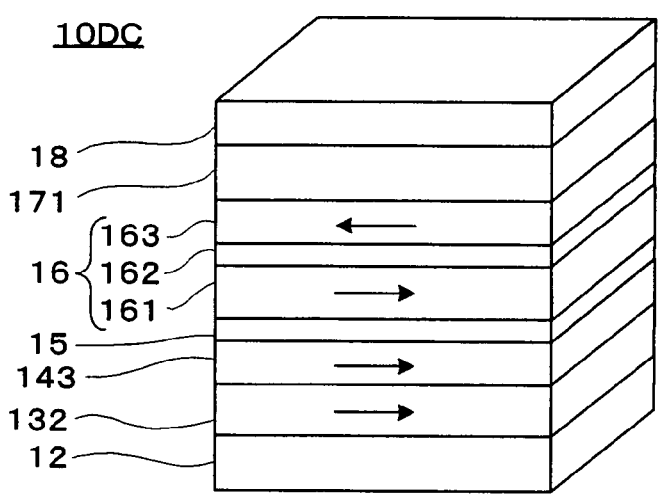
FIG. 28 is a perspective view showing a structural example of a magneto-resistive film in which one of upper and lower pinned layers has a synthetic pinned structure and the other has a single-layer pinned structure.
Figure 29:
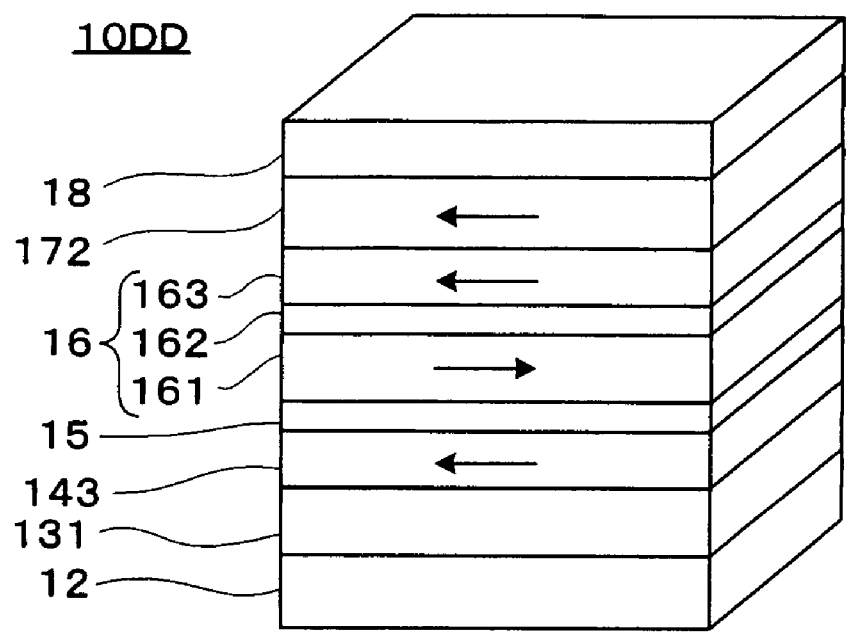
FIG. 29 is a perspective view showing a structural example of a magneto-resistive film in which one of upper and lower pinned layers has a synthetic pinned structure and the other has a single-layer pinned structure.
Figure 30:
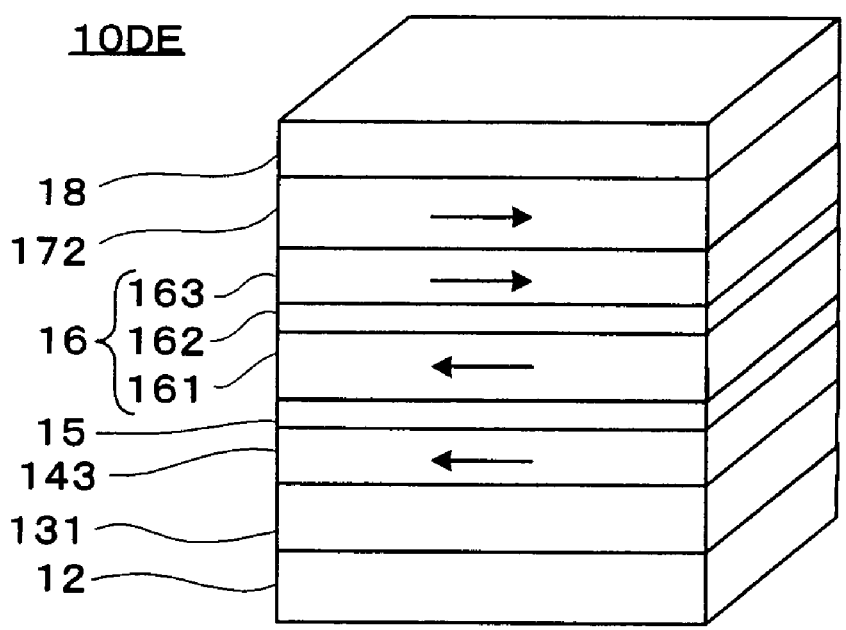
FIG. 30 is a perspective view showing a structural example of a magneto-resistive film in which one of upper and lower pinned layers has a synthetic pinned structure and the other has a single-layer pinned structure.
Figure 31:
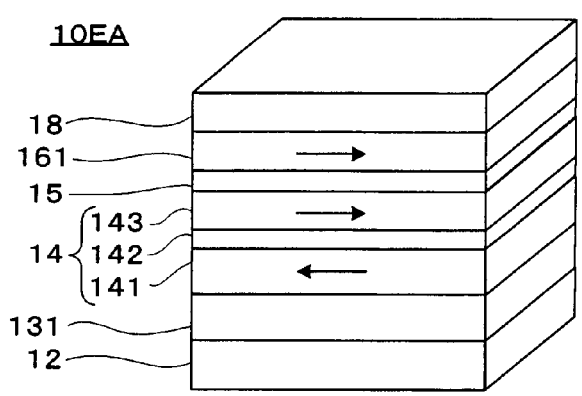
FIG. 31 is a perspective view showing a structural example of a magneto-resistive film with only one pinning layer.
Figure 32:
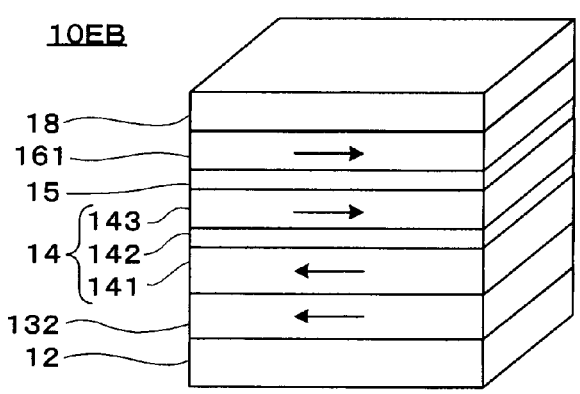
FIG. 32 is a perspective view showing a structural example of a magneto-resistive film with only one pinning layer.
Figure 33:
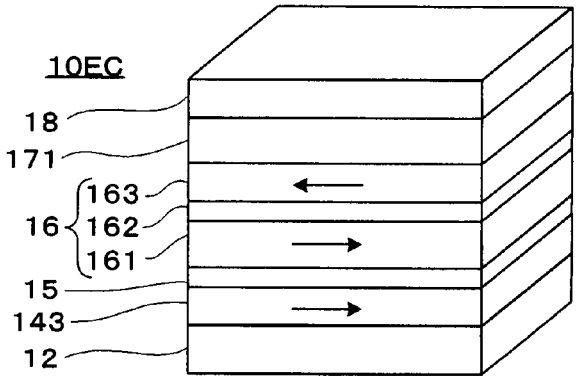
FIG. 33 is a perspective view showing a structural example of a magneto-resistive film with only one pinning layer.
Figure 34:
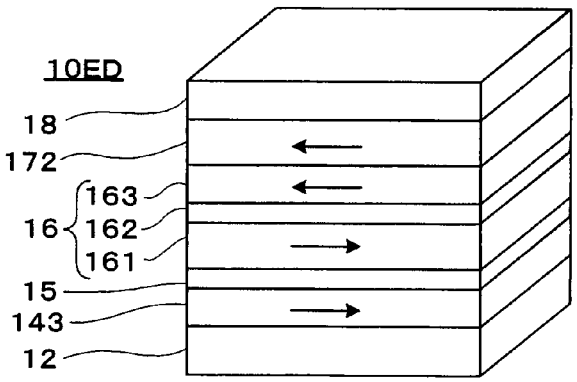
FIG. 34 is a perspective view showing a structural example of a magneto-resistive film with only one pinning layer.

FIG. 8 is a graph showing the correlation between an oxygen flow rate and a magneto-resistance ratio MR when the TiOx layer (the external magnetic field sensing layer 15) in the magneto-resistive film 10 is formed. The film structure at this time is the same as that of the above-described example.

As is seen from FIG. 8, when the oxygen supply amount is small (oxidation is insufficient), no increase in the magneto-resistance ratio MR is observed. When the oxygen supply amount reaches a certain value, the magneto-resistance ratio drastically increases. Further, when the oxygen supply amount becomes too large, the magneto-resistance ratio MR drastically drops. That is, for better characteristic of the magneto-resistive film 10, it is necessary to appropriately select the oxidation condition under which the external magnetic field sensing layer 15 is formed.

(Multilayer Structure of Magneto-Resistive Film)

Hereinafter, the multilayer structure of the magneto-resistive film will be described. As described above, three layers of the pinned layer 14/the external magnetic field sensing layer 15/the pinned layer 16 constitute the basic structure of the magneto-resistive film 10, but the multilayer structure can vary.

Multilayer Film Structure A: in a Case where the Upper and Lower Pinned Layers 14, 16 Both Have the Synthetic Pinned Structure FIG. 9 to FIG. 14 are perspective views showing structural examples of magneto-resistive films 10AA to 10AF in which upper and lower pinned layers both have synthetic pinned structures. The structures in FIG. 9 to FIG. 14 are basically the same as that shown in FIG. 2. As the pinning layers 13, 17, antiferromagnetic layers 131, 171 and hard magnetic layers 132, 172 are variably combined.

In the magneto-resistive film 10AA, the antiferromagnetic layers 131, 171 are used as the upper and lower pinning layers 13, 17. Therefore, the pinning of the upper and lower antiferromagnetic layers (the pinned layers 14, 16) is determined by the direction of the magnetic field applied during the magnetic annealing. Therefore, the pinned layers 141, 163 have the same magnetization direction. The magnetization directions of the pinned layers 143, 161 in contact with the external magnetic field sensing layer 15 are antiparallel to that of the pinned layers 141, 163 and are substantially the same. As the antiferromagnetic layers 131, 171, a metal antiferromagnetic layer or the like of IrMn, PtMn, PdPtMn, NiMn, RuMn, RhMn, RuRhMn, or the like is usable.

In the magneto-resistive film 10AB, the upper and lower pinned layers 14, 16 are pinned by the hard magnetic layers 132, 172. Materials usable as the hard magnetic layers 132, 172 include Co whose main component is hcp-Co, a Co alloy, CoPt, a CoPrCr alloy, FePt, and any of these materials to which an additive element is added.

In the magneto-resistive film 10AC, the antiferromagnetic layer 131 is used as the pinning layer 13 and the hard magnetic layer 172 is used as the pinning layer 17. The aforesaid materials are usable for the antiferromagnetic layer 131 and the hard magnetic layer 172. Here, the magnetization direction of the pinned layers 143, 161 in contact with the external magnetic field sensing layer 15 is the same as that in the magneto-resistive film 10AB. The magnetization of the hard magnetic layer 172 is fixed so as to realize such a magnetization arrangement state. Here, the hard magnetic layer 172 and the pinned layer 163 may be separate magnetic layers or one-layer material may serve the both functions. If they are two separate layers, a magnetic layer with a hard magnetic property (the hard magnetic layer 172) and a magnetic layer advantageous for improving a magneto-resistance ratio (the pinned layer 163) can be independently designed.

The magneto-resistive film 10AD has substantially the same structure as that of the magneto-resistive film 10AC, but the magnetization fixation direction of the hard magnetic layer 172 is reverse to that in the magneto-resistive film 10AC. That is, the magnetization of the hard magnetic layer 172 is fixed so that the magnetization directions of the pinned layers 143, 161 in contact with the external magnetic field sensing layer 15 are antiparallel to each other. The use of the antiferromagnetic layers 131, 171 as the respective pinning layers 13, 17 as in the magneto-resistive film 10AA causes the pinned layers 143, 161 to have the same magnetization direction. On the other hand, when the hard magnetic layer 172 is used, it is possible to fix the magnetization in any direction by applying a large magnetic field after the magnetic heat treatment. This can realize structural variations such as the magneto-resistive films 10AC, 10AD.

In the structures of the magneto-resistive films 10AE, 10AF, the upper pinning layer and the lower pinning layer of the magneto-resistive films 10AC, 10AD are replaced by each other. The hard magnetic layer 132 is disposed on a lower side of the external magnetic field sensing layer 15. As in the magneto-resistive films 10AC, 10AD, the magnetization fixation directions of the hard magnetic layers 132 in the magneto-resistive films 10AE, 10AF are reverse to each other.

The structure of the magneto-resistive films 10AE, 10AF is different from the structure of the magneto-resistive films 10AC, 10AD in the following respect. That is, in the structure of the magneto-resistive films 10AE, 10AF, the hard magnetic layer 132 is disposed on a base layer side. Therefore, for the base layer 12 under the hard magnetic layer 132, a base material strengthening hard magnetism can be selected. For example, as the base layer 12, it is possible to select a metal layer containing Cr, W, V, or the like with the bcc structure in order to realize the in-plane magnetization direction of the hard magnetic layer. Further, as the base layer 12, it is possible to use a material that is suitable for making the hard magnetic layer 132 a perpendicular magnetization film with a perpendicular-to-plane magnetization direction. As a material of the perpendicular magnetization film, usable is: a Co-containing alloy, concretely, CoCr or CoCrPt; either of these with an additive element; FePt; or the like.

Multilayer Film Structure B: in a Case where the Upper and Lower Pinned Layers 14, 16 Have a Single-Layer Pinned Structure FIG. 15 to FIG. 20 are perspective views showing a structural examples of magneto-resistive films 10BA to 10BF in which upper and lower pinned layers both have single-layer pinned structures. Magneto-resistive films 10BA to 10BF are basically the same as the magneto-resistive films 10AA to 10AF except in that the upper and lower pinned layers 14, 16 both have a single-layer pinned structure.

The use of the single-layer pinned structure instead of the synthetic pinned structure can reduce the total thickness of the spin-valve film. However, the non-use of the synthetic structure involves a possibility that a pinned/fixed magnetic field becomes weaker than that in the case where the synthetic pinned structure is used. According to necessary specifications, the structure of the magneto-resistive films 10AA to 10AF and the structure of the magneto-resistive films 10BA to 10BF are selectively adopted.

In the magneto-resistive film 10BA, the antiferromagnetic layers 131, 171 are used as the upper and lower pinning layers 13, 17 respectively. The pinning of the upper and lower antiferromagnetic layers 131, 171 is determined by the direction of the magnetic field applied during the magnetic annealing. Therefore, the magnetization directions of the pinned layers 14, 16 are the same. Here, an example usable as a material of the antiferromagnetic layers 131, 171 is a metal antiferromagnetic layer of IrMn, PtMn, PdPtMn, NiMn, RuMn, RhMn, or RuRhMn.

In the magneto-resistive film 10BB, the upper and lower pinned layers 14, 16 are pinned by the hard magnetic layers 132, 172 respectively. At this time, the hard magnetic layers 132, 172 can also function as pinned layers. For the hard magnetic layers 132, 172, Co whose major component is hcp-Co, a Co alloy, CoPt, a CoPrCr alloy, or FePt is usable, or any of these materials with an additive element being added is also usable.

In the magneto-resistive film 10BC, the antiferromagnetic layer 131 is used as the pinning layer 13 and the hard magnetic layer 172 is used as the pinning layer 17. The antiferromagnetic layer 131 and the hard magnetic layer 172 can be made of the aforesaid materials. Here, the magnetization directions of the pinned layers 143, 161 in contact with the external magnetic field sensing layer 15 are antiparallel to each other. The magnetization of the hard magnetic layer 172 is fixed so as to realize such a magnetization arrangement direction. Here, the hard magnetic layer 172 and the pinned layer 161 may be separate magnetic layers, or one-layer material may serve the functions of the both. If the hard magnetic layer 172 and the pinned layer 161 are two separate layers, a magnetic layer with a hard magnetic property (hard magnetic layer 172) and a magnetic layer advantageous for improving a magneto-resistance ratio (pinned layer 163) can be independently designed.

The magneto-resistive film 10BD has substantially the same structure as that of the magneto-resistive film 10BC, but the magnetization fixation direction of the hard magnetic layer 172 is reverse to that in the magneto-resistive film 10BC. That is, the magnetization of the hard magnetic layer 172 is fixed so that the magnetization directions of the pinned layers 143, 161 in contact with the external magnetic field sensing layer 15 are parallel to each other. The adoption of the synthetic pinned structure by the antiferromagnetic layers 131, 171 as both of the pinning layers 13, 17 as in the magneto-resistive film 10BA causes the pinned layers 143, 161 to have the same magnetization direction. On the other hand, if the hard magnetic layer 172 is used, it is possible to fix the magnetization in any direction by applying a large magnetic field after the magnetic heat treatment. This can realize structural variations such as the magneto-resistive films 10BC, 10BD.

In the structures of the magneto-resistive films 10BE, 10BF, the upper layer and the lower layer of the magneto-resistive films 10BC, 10BD are replaced by each other. The hard magnetic layer 132 is disposed on a lower side of the external magnetic field sensing layer 15. As in the magneto-resistive films 10BC, 10BD, the magnetization fixation directions of the hard magnetic layers 132 in the magneto-resistive films 10BE, 10BF are reverse to each other.

The structure of the magneto-resistive films 10BE, 10BF is different from the structure of the magneto-resistive films 10BC, 10BD in the following respect. That is, in the structure of the magneto-resistive films 10BE, 10BF, the hard magnetic layer 132 is disposed on a base layer 12 side. Therefore, for the base layer 12 under the hard magnetic layer 132, a base material strengthening hard magnetism can be selected. For example, as the base layer 12, it is possible to select a metal layer containing Cr, W, V, or the like with the bcc structure in order to realize the in-plane magnetization direction of the hard magnetic layer 132. Further, as the base layer 12, it is possible to use a material that is suitable for making the hard magnetic layer 132 a perpendicular magnetization film with a perpendicular-to-plane magnetization direction. Similarly to the aforesaid case, as the material of the perpendicular magnetization film, usable is: a Co-containing alloy, concretely, CoCr or CoCrPt; either of these with an additive element; FePt; or the like.

Multilayer Film Structure C: in a Case where the Pinned Layer 14 has a Synthetic Pinned Structure and the Pinned Layer 16 has a Single-Layer Pinned Structure FIG. 21 to FIG. 25 are perspective views showing structural examples of magneto-resistive films in which one of upper and lower pinned layers has a synthetic pinned structure and the other has a single-layer pinned structure. In magneto-resistive films 10CA to 10CE shown in FIG. 21 to FIG. 25, the pinned layer 14 has a synthetic pinned structure and the pinned layer 16 has a single-layer pinned structure.

In the magneto-resistive film 10CA, the antiferromagnetic layers 131, 171 are used as the upper and lower pinning layers 13, 17. The pinning directions by the upper and lower antiferromagnetic layers 131, 171 are determined by the direction of the magnetic field applied during the magnetic annealing. Therefore, the magnetization directions of the pinned layers 141, 161 are the same.

However, unlike the cases of the magneto-resistive films 10AA to 10AF, the pinned layer 16 does not have the synthetic pinned structure. Consequently, even if the magnetization directions fixed by the antiferromagnetic layers 131, 171 are the same, the magnetization directions of the pinned layers 143, 161 in contact with the external magnetic field sensing layer 15 are antiparallel to each other. An example usable as the antiferromagnetic layers 131, 171 is a metal ferromagnetic layer of IrMn, PtMn, PdPtMn, NiMn, RuMn, RhMn, RuRhMn, or the like.

In the magneto-resistive film 10CB, the antiferromagnetic layer 131 is used as the pinning layer 13 and the hard magnetic layer 172 is used as the pinning layer 17. Examples usable as a material of the hard magnetic layer 172 include Co whose major component is hcp-Co, a Co alloy, CoPt, a CoPrCr alloy, FePt, and any of these materials with an additive element being added.

In the magneto-resistive film 10CC, the antiferromagnetic layer 131 is used as the pinning layer 13 and the hard magnetic layer 172 is used as the pinning layer 17, as in the magneto-resistive film 10CB. The antiferromagnetic layer 131 and the hard magnetic layer 172 can be made of the aforesaid materials. Here, the magnetization of the pinned layers 143, 161 in contact with the external magnetic field sensing layer 15 are fixed by the hard magnetic layer 172 so as to be parallel to each other. Here, the hard magnetic layer 172 and the pinned layer 161 may be separate magnetic layers, or one-layer material may serve the functions of the both. If the hard magnetic layer 172 and the pinned layer 161 are two separate layers, a magnetic layer with a hard magnetic property (hard magnetic layer 172) and a magnetic layer advantageous for improving a magneto-resistance ratio (pinned layer 161) can be independently designed.

In the structures of the magneto-resistive film 10CD, the upper side and the lower side of the magneto-resistive films 10CB are replaced by each other. That is, the hard magnetic layer 132 is used as the pinning layer 13 and the antiferromagnetic layer 171 is used as the pinning layer 17. The hard magnetic layer 132 is disposed on a base layer 12 side, and therefore, for the base layer 12 under the hard magnetic layer 132, a base material strengthening hard magnetism can be selected. For example, as the base layer 12, it is possible to use, for example, a metal layer containing Cr, W, V, or the like with the bcc structure in order to realize the in-plane magnetization direction of the hard magnetic layer 132. Further, as the base layer 12, it is possible to use a material that is suitable for causing the hard magnetic layer 132 to have a perpendicular magnetization direction.

In the magneto-resistive film 10CE, the magnetization direction fixed by the hard magnetic layer 132 is reverse to that in the magneto-resistive film 10CD. The magneto-resistive film 10CE is different from the magneto-resistive film 10CD in the magnetization fixation directions of the pinned layers 143, 161 on the upper and lower side of the external magnetic field sensing layer 15.

Multilayer Film Structure D: in a Case where the Pinned Layer 14 has a Single-Layer Pinned Structure and the Pinned Layer 16 has a Synthetic Pinned Structure FIG. 30 to FIG. 34 are perspective views showing a structural examples of a magneto-resistive films 10DA to 10DE which are the same as the magneto-resistive films 10CA to 10CF except in that the pinned layer 14 has a single-layer pinned structure and the pinned layer 16 has a synthetic pinned structure.

Multilayer Film Structure E: in a Case where there Exists One Pinning Layer

FIG. 31 to FIG. 34 are perspective views showing a structural example of a magneto-resistive films 10EA to 10ED, in which a magneto-resistive effect occurs by the mechanism (3). In the magneto-resistive films 10EA to 10ED, magnetic layers (pinned layers 143, 161) on the upper and lower sides of the external magnetic field sensing layer 15 are in strong magnetic coupling to each other via the external magnetic field sensing layer 15. In this case, owing to the strong magnetic coupling of the pinned layers 143, 161 via the external magnetic field sensing layer 15, one of the pinning layers 13, 17 can be omitted.

In the magneto-resistive films 10EA, 10EB, the pinning layer 13 is disposed only on the pinned layer 14 side, and the pinned layer 14 is magnetically fixed. The magneto-resistive film 10EA uses the antiferromagnetic layer 131 as the pinning layer 13 and has a synthetic pinned structure. The magneto-resistive film 10EB uses the hard magnetic layer 132 as the pinning layer 13 and has a synthetic pinned structure. The magnetization of the pinned layer 161 is fixed due to the magnetic coupling to the pinned layer 143. As a result, the pinning layer 13 is shared by the pinned layers 14, 16.

In the magneto-resistive films 10EC, 10ED, the pinning layer 17 is disposed only on the pinned layer 16 side and the pinned layer 16 is magnetically fixed. The magneto-resistive film 10EC uses the antiferromagnetic layer 171 as the pinning layer 17 and has a synthetic pinned structure. The magneto-resistive film 10ED uses the hard magnetic layer 172 as the pinning layer 17 and has a synthetic pinned structure.

The magneto-resistive films 10EA to 10ED are all examples having the synthetic pinned structure. Instead of the synthetic pinned structure, a single-layer pinned structure is also usable.

Figure 35:
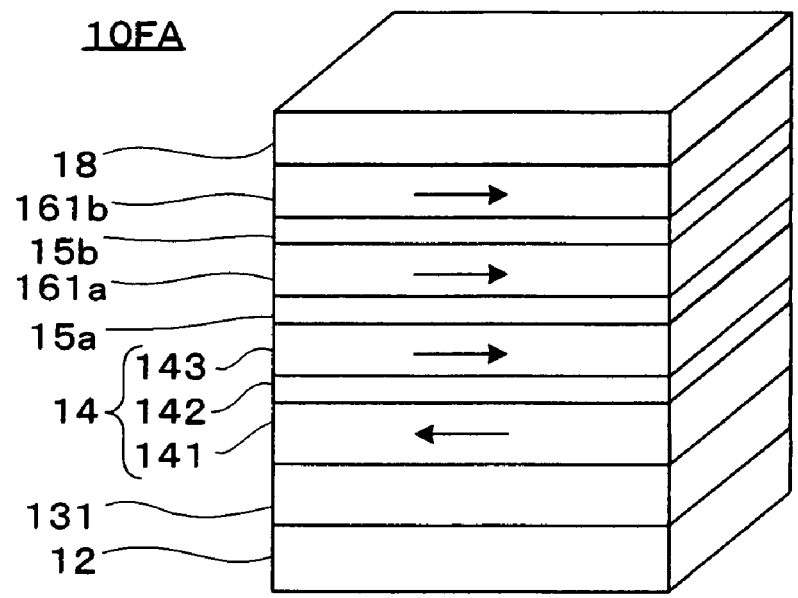
FIG. 35 is a perspective view showing a structural example of a magneto-resistive film having a plurality of external magnetic field sensing layers.
Figure 36:
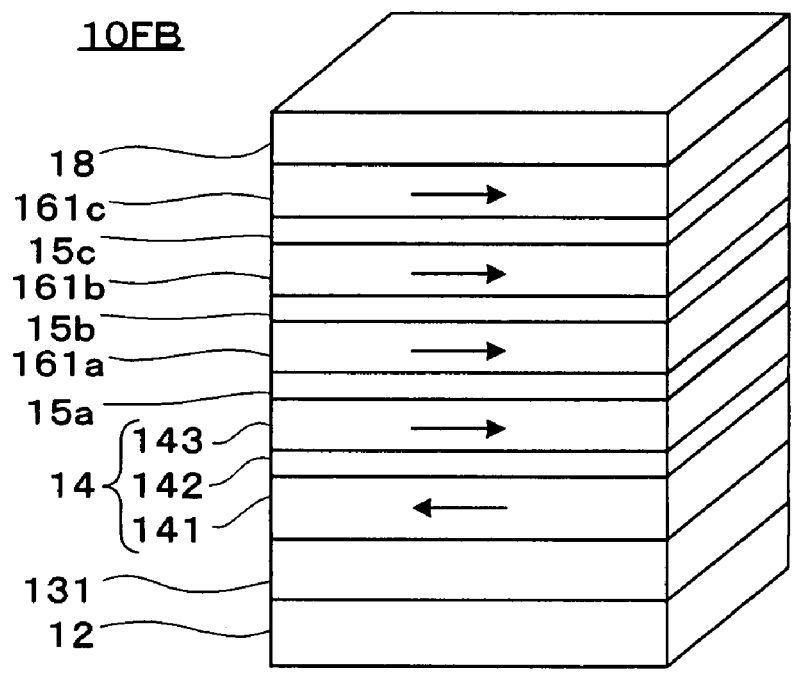
FIG. 36 is a perspective view showing a structural example of a magneto-resistive film having a plurality of external magnetic field sensing layers.

Multilayer Film Structure F: in a Case where the Plural External Magnetic Field Sensing Layers 15 are Disposed Magneto-resistive effect films 10FA, 10FB shown in FIG. 35 and FIG. 36 each have the plural external magnetic field sensing layers 15.

This structure is effective in a case where the magneto-resistive effect occurs by the mechanism (3). In a case where the plural external magnetic field sensing layers 15 are disposed, some of the pinned layers do not come in direct contact with the pinning layer 13 because of the multilayer film structure. However, if the magneto-resistive effect occurs by the mechanism (3), the upper and lower magnetic layers (pinned layers) are magnetically coupled via the external magnetic field sensing layer 15. This makes such a structure possible. In this structure, the external magnetic field sensing layer 15 being an important layer where the magneto-resistance occurs are disposed in plurality, which makes it possible to increase the magneto-resistance ratio depending on the number of layers.

The magneto-resistive film 10FA uses the antiferromagnetic layer 131 as the pinning layer 13 and has a synthetic pinned structure. However, instead of the antiferromagnetic layer 131, the hard magnetic layer 132 may be used as the pinning layer 13.

An external magnetic field sensing layer 15a is disposed on the pinned layer 14 with the synthetic pinned structure, and a pinned layer 161a is disposed thereon. The pinned layer 143 and the pinned layer 161a are in strong magnetic coupling via the external magnetic field sensing layer 15a.

An external magnetic field sensing layer 15b and a pinned layer 161b are provided on the pinned layer 161a. The pinned layers 161a, 161b are pinned by the pinning layer 13 via the external magnetic field sensing layer 15b.

That is, only with the single pinning layer 13, the magnetization of the plural pinned layers 161a, 161b can be fixed via the plural external magnetic field sensing layers 15a, 15b. Since there exist the plural external magnetic field sensing layers 15a, 15b, a magneto-resistance ratio can be increased in proportion to the number of the external magnetic field sensing layers.

The magneto-resistive film 10FB has the single pinning layer 13 on a lower layer side similarly to the magneto-resistive film 10FA and has a synthetic pinned structure. The magneto-resistive film 10FB uses the antiferromagnetic layer 131 as the pinning layer 13. However, instead of the antiferromagnetic layer 131, the hard magnetic layer 132 may be used.

In the magneto-resistive film 10FB, the number of the external magnetic field sensing layer 15 is larger by one than that in the magneto-resistive film 10FA, so that the total number thereof is three. Owing to the increase in the number of the external magnetic field sensing layers 15, the magneto-resistance ratio can have a larger value. The pinned layers 161a to 161c are pinned by the pinning layer 13 via the plural external magnetic field sensing layers 15a, 15b, 15c.

(Applications of Magneto-Resistive Element)

Hereinafter, applications of the magneto-resistive element (spacer-layer-less spin-valve element) according to the embodiment of the present invention will be described.

In the embodiment, an element resistance RA of the spacer layer-less spin-valve element is preferably 2000 m$\Omega\mu m^2$ or less, more preferably 1000 m$\Omega\mu m^2$ or less, from the viewpoint of adaptability to high density. To calculate the element resistance RA, a resistance R of a CPP element is multiplied by an effective area A of a current passage portion of a spin-valve film. Here, the element resistance R can be directly measured. On the other hand, since the effective area A of the current passage portion of the spin-valve film is a value dependent on the element structure, the value of the effective area A has to be determined with care.

For example, in a case where the entire spin-valve film is patterned as an area for effective sensing, an area of the whole spin-valve film is the effective area A. In this case, from the viewpoint of moderate setting of the element resistance, the area of the spin-valve film is set to 0.04 $\mu m^2$ or less at most, and for the recording density of 200 Gbpsi or more, it is set to 0.02 $\mu m^2$ or less.

However, if the lower electrode 11 or the upper electrode 20 smaller in area than the spin-valve film is formed in contact with the spin-valve film, the area of the lower electrode 11 or the upper electrode 20 is the effective area A of the spin-valve film. If the lower electrode 11 and the upper electrode 20 are different in area, an area of the smaller electrode is the effective area A of the spin-valve film. In this case, from the viewpoint of moderate setting of the element resistance, the area of the smaller electrode is set to 0.04 $m^2$ or less at most.

Figure 37:
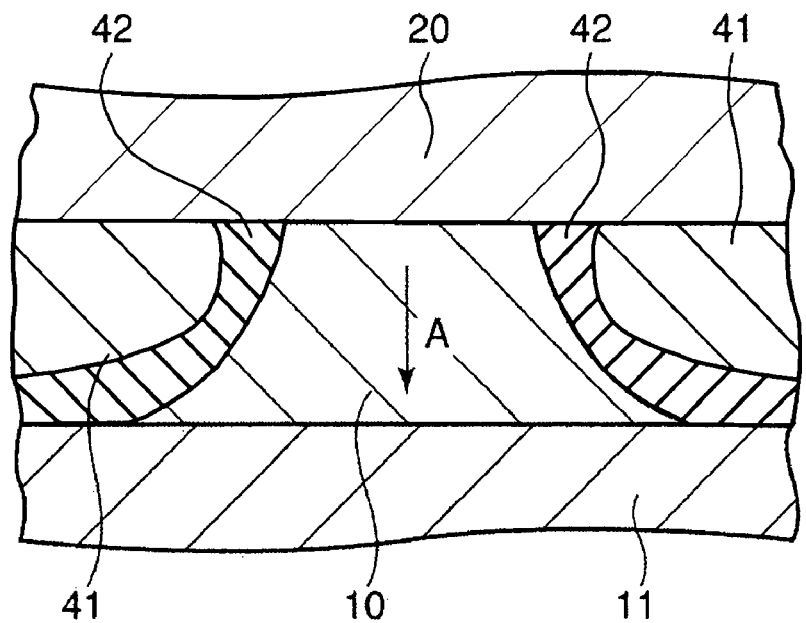
FIG. 37 is a view showing a magnetic head in which the magneto-resistive film according to the embodiment is incorporated.
Figure 38:
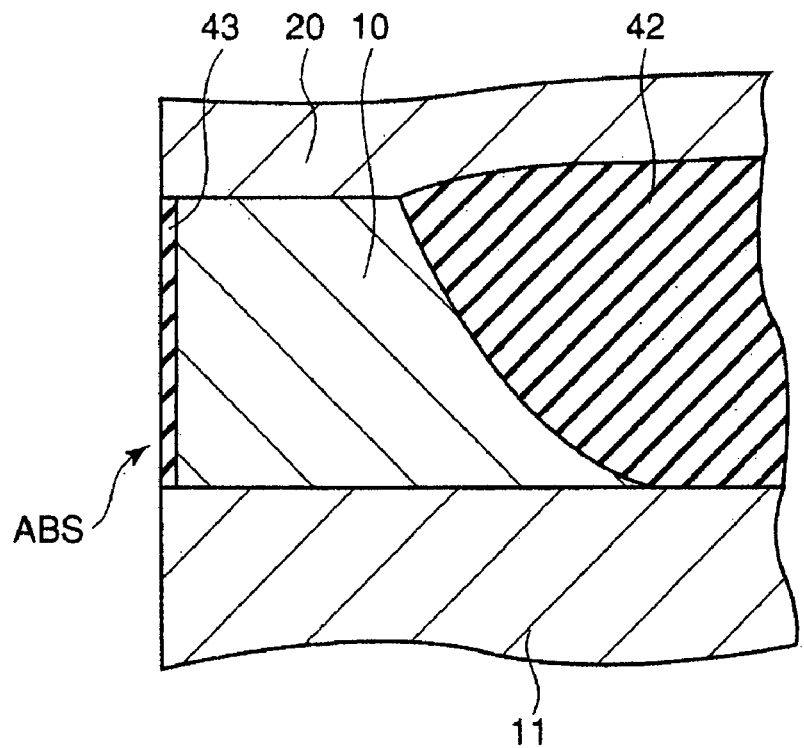
FIG. 38 is a view showing the magnetic head in which the magneto-resistive film according to the embodiment is incorporated.

In an example shown in FIG. 37 and FIG. 38 to be described in detail later, since a portion with the smallest area in the spin-valve film in FIG. 37 is a portion in contact with the upper electrode 20, a width of this portion is defined as a track width Tw. As for a height direction, a portion in contact with the upper electrode 20 in FIG. 38 is also the smallest, and therefore, a width of this portion is defined as a height length D. The effective area A of the spin-valve film is defined as A=T×D.

In the magneto-resistive element according to the embodiment, the resistance R between the electrodes can be set to 100Ω or less. This resistance R is, for example, a resistance value that is measured between two electrode pads of a reproducing head attached to a tip of a head gimbal assembly (HGA).

The magneto-resistive element according to the embodiment desirably has fcc(111) orientation when the pinned layers 14, 16 have the fcc structure. Bcc(110) orientation is desirable if the pinned layers 14, 16 have a bcc structure. Hcp(001) orientation or hcp(110) orientation is desirable if the pinned layers 14, 16 have a hcp structure.

As for crystal orientation of the magneto-resistive element according to the embodiment, a dispersion angle of the orientation is preferably within 5.0 degrees, more preferably within 3.5 degrees, still more preferably within 3.0 degrees. This value can be found as a full-width at half-maximum of a rocking curve at a peak position, which is obtained by θ-2θ measurement of X-ray diffraction. This value can also be found as a dispersion angle of a spot in a nano-diffraction spot from an element cross section.

If an antiferromagnetic layer is used as the pinning layer 13, the orientation dispersion angle in the antiferromagnetic film and that in the pinned layer can be separately calculated, since the antiferromagnetic film and the pinned layer are generally different in lattice interval, though depending on a material of the antiferromagnetic film. For example, iridium manganese (IrMn) and the pinned layer are often different in lattice interval. Being a relatively thick film, iridium manganese (IrMn) is a material suitable for the measurement of the dispersion angle of the crystal orientation.

(Magnetic Head)

FIG. 37 and FIG. 38 show a state where the magneto-resistive element according to the embodiment is assembled in a magnetic head. FIG. 37 is a cross-sectional view in a state where the magneto-resistive element is cut along a direction substantially parallel to an air bearing surface ABS facing a magnetic recording medium (not shown). FIG. 38 is a cross-sectional view in a state where the magneto-resistive element is cut along a direction perpendicular to the air bearing surface ABS.

The magnetic head shown in FIG. 37 and FIG. 38 as an example has a so-called hard abutted structure. The magneto-resistive film 10 is the aforesaid space-layer-less spin-valve film. The lower electrode 11 and the upper electrode 20 are provided on the upper and lower sides of the magneto-resistive film 10 respectively. In FIG. 37, a bias field application film 41 and an insulation film 42 are stacked on both sides of the magneto-resistive film 10 respectively. As shown in FIG. 38, a protective layer 43 is formed on the air bearing surface ABS of the magneto-resistive film 10.

A sense current to the magneto-resistive film 10 is supplied by the lower electrode 11 and the upper electrode 20 disposed on the upper and lower sides thereof, in a substantially perpendicular direction to the film plane as shown by the arrow A. Further, applying a bias magnetic field to the magneto-resistive film 10 by the pair of bias field application films 41, 41 disposed on the right and left is also a preferable example.

By this bias magnetic field, a single magnetic domain is formed in the external magnetic field sensing layer 15 of the magneto-resistive film 10. As a result, the magnetic domain structure of the external magnetic field sensing layer 15 is stabilized and Barkhousen noise accompanying the movement of magnetic domain walls can be reduced. However, if the external magnetic field sensing layer 15 has no magnetization (in the cases where the magneto-resistive effect occurs by the mechanisms (1), (2)), the bias field application film is not sometimes needed.

The magneto-resistive film 10, when applied to a magnetic head, enables highly sensitive magnetic reproduction because of its improved S/N ratio.

(Hard Disk and Head Gimbal Assembly)

The magnetic head shown in FIG. 37 and FIG. 38 can be assembled in a magnetic head assembly of a recording/reproduction integrated type, which can then be mounted in a magnetic recording/reproducing apparatus.

Figure 39:
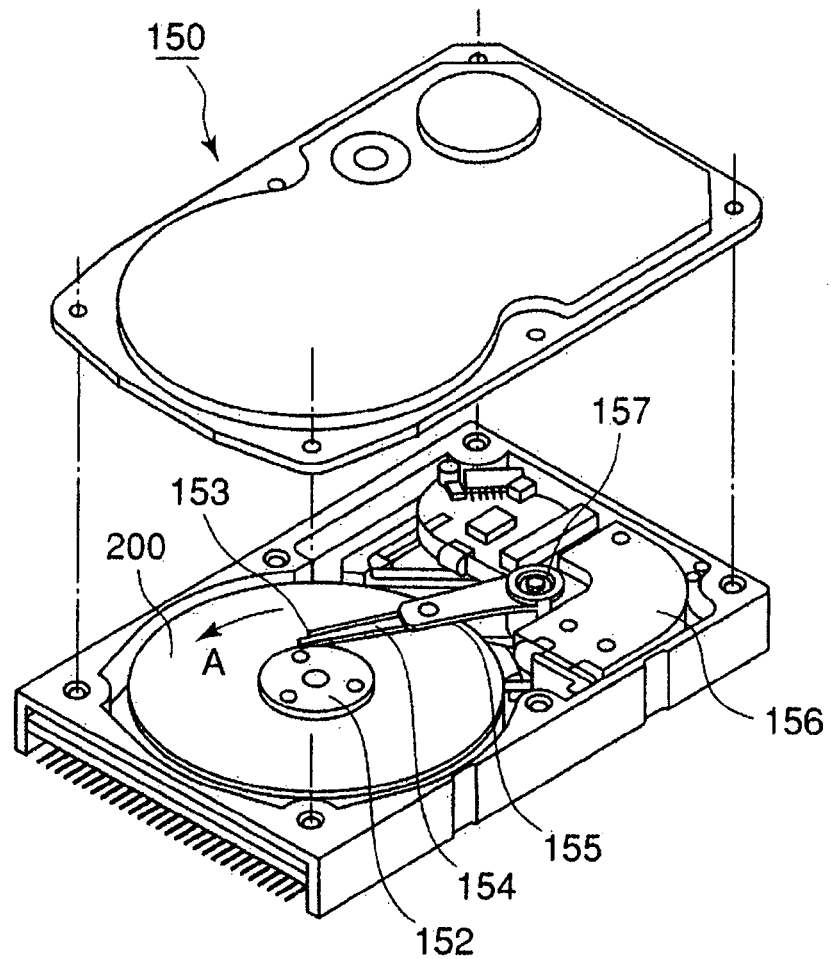
FIG. 39 is a perspective view showing a rough structure of an essential part of a magnetic recording/reproducing apparatus.

A magnetic recording/reproducing apparatus 150 of this embodiment shown in FIG. 39 uses a rotary actuator. In FIG. 39, a magnetic disk 200 is loaded to a spindle 152 and rotates in the arrow A direction by a not-shown motor that responds to control signals from a not-shown driver control part. The magnetic recording/reproducing apparatus 150 of this embodiment may include a plurality of magnetic disks 200.

A head slider 153 for recording/reproducing information stored on the magnetic disk 200 is attached to a tip of a thin film suspension 154. The head slider 153 has in the vicinity of its tip a magnetic head including the magneto-resistive element according to any of the aforesaid embodiments.

When the magnetic disk 200 rotates, an air bearing surface (ABS) of the head slider 153 is kept floated from a surface of the magnetic disk 200 by a predetermined height. Alternatively, the head slider 153 may be a so-called "in-contact" slider that comes in contact with the magnetic disk 200.

The suspension 154 is connected to one end of an actuator arm 155. A voice coil motor 156 which is a kind of a linear motor is provided at the other end of the actuator arm 155. The voice coil motor 156 is composed of: a not-shown driving coil wound around a bobbin; and a magnetic circuit including a permanent magnet and a counter yoke which face each other to sandwich the driving coil.

The actuator arm 155 is held by not-shown ball bearings or the like provided at two places, namely, upper and lower sides of the spindle 157, and is rotatable/slidable by the voice coil motor 156.

Figure 40:
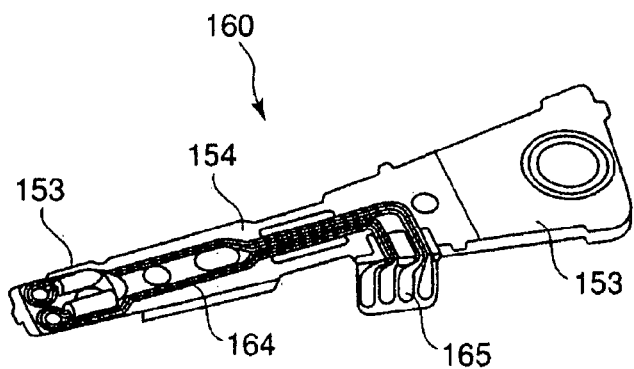
FIG. 40 is an enlarged perspective view showing a part ahead of an actuator arm of a head gimbal assembly, which is viewed from a disk side.

As shown in FIG. 40, an assembly 160 has the actuator arm 155, and the suspension 154 is connected to the one end of the actuator arm 155. To the tip of the suspension 154, the head slider 153 provided with the magnetic head including the magneto-resistive element according to any of the above-described embodiments is attached. The suspension 154 has leads 164 for signal write and read, and the leads 164 and electrodes of the magnetic head assembled in the head slider 153 are electrically connected. The reference numeral 165 in FIG. 40 denotes electrode pads of the assembly 160.

Having the magnetic head including the aforesaid magneto-resistive element, the magnetic recording/reproducing apparatus according to this embodiment can surely read information magnetically recorded on the magnetic disk 200 with high recording density.

(Magnetic Memory)

Next, a description will be given of a magnetic memory including the magneto-resistive element according to any of the above-described embodiments. That is, the use of the magneto-resistive element according to any of the embodiments can realize a magnetic memory such as, for example, a magnetic random access memory (MRAM) in which memory cells are arranged in matrix.

Figure 41:
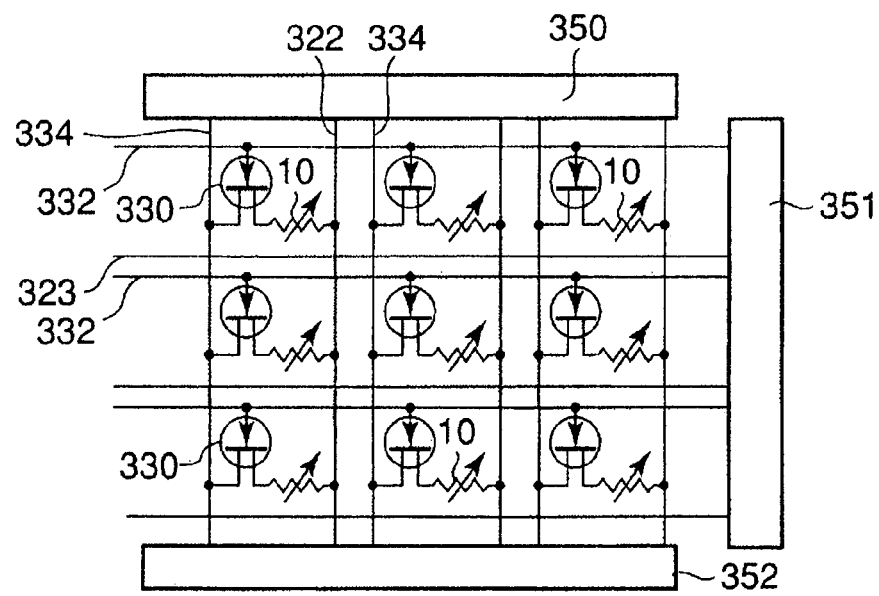
FIG. 41 is a view showing an example of a matrix structure of a magnetic memory according to an embodiment of the present invention.

A magnetic memory according to this embodiment shown in FIG. 41 has a circuit configuration in which memory cells are arrayed. A column decoder 350 and a row decoder 351 are provided to select one bit in the array, and by selecting a specific bit line 334 and a specific word line 332, a switching transistor 330 is turned on and uniquely selected. A sense amplifier 352 detects this selection and thereby is capable of reading bit information recorded on a magnetic recording layer (free layer) in the magneto-resistive film 10. To write the bit information, a write current is passed through the specific read word line 323 and bit line 322 and a generated magnetic field is applied.

Figure 42:
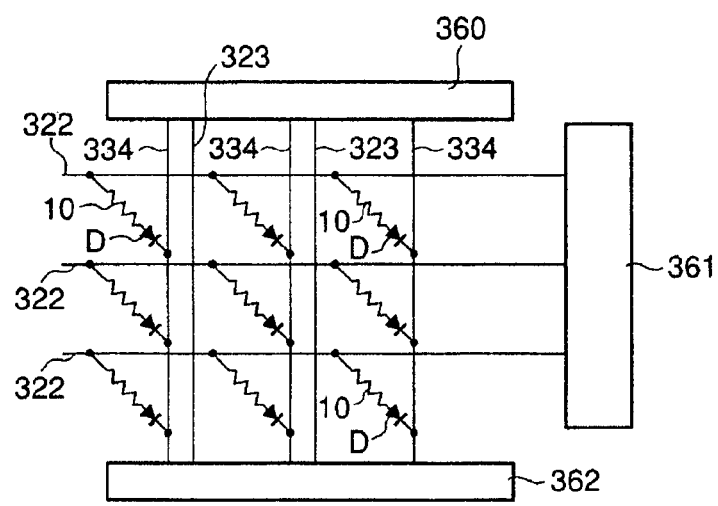
FIG. 42 is a view showing another example of the matrix structure of the magnetic memory according to the embodiment.

In a magnetic memory as another example according to this embodiment shown FIG. 42, a specific one of bit lines 322 and a specific one of word lines 334 are selected by decoders 360, 361 respectively, the bit lines 322 and the word lines 334 being arranged in matrix. Consequently, a specific memory cell is selected from the array. Each of the memory cells has a structure in which the magneto-resistive element 10 and a diode D are connected in series. Here, the diode D functions to prevent a sense current from flowing to memory cells other than the memory cell corresponding to the selected magneto-resistive element 10. To write information, a write current is passed through the specific bit line 322 and word line 323 and a generated magnetic field is applied.

Figure 43:
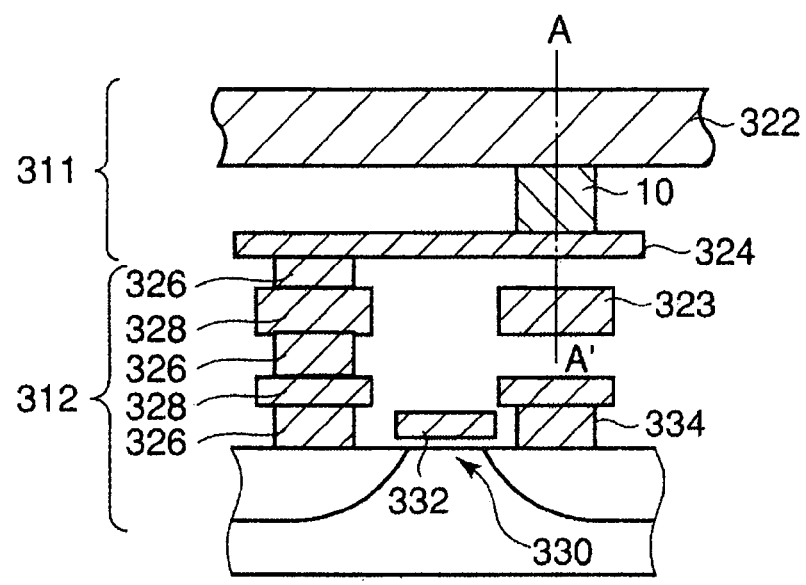
FIG. 43 is a cross-sectional view showing an essential part of the magnetic memory according to the embodiment.
Figure 44:
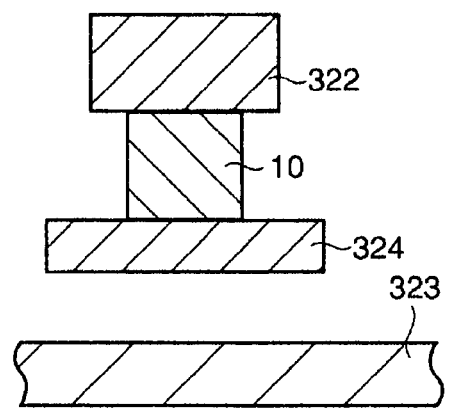
FIG. 44 is a cross-sectional view taken along the A-A' line in FIG. 18.

The structure shown in FIG. 43 and FIG. 44 corresponds to a memory cell of one bit included in the magnetic memory shown in FIG. 41 or FIG. 42. This memory cell has a storage element part 311 and an address selection transistor part 312.

The storage element part 311 has the magneto-resistive element 10 and a pair of wires 322, 324 connected thereto. The magneto-resistive element 10 is the magneto-resistive element according to any of the above-described embodiments.

In the address selection transistor part 312, provided is a transistor 330 connected to the magneto-resistive element 10 through vias 326 and buried wires 328. The transistor 330 performs a switching operation according to a voltage applied to a gate 332 to control opening/closing of a current path between the magneto-resistive element 10 and a wire 334.

Further, a write wire 323 is disposed under the magneto-resistive element 10 to extend in a direction substantially orthogonal to a direction in which the wire 322 extends. These write wires 322, 323 can be formed of, for example, aluminum (Al), copper (Cu), tungsten (W), or tantalum (Ta), or of an alloy containing one of these elements.

In the memory cell as structured above, to write bit information to the magneto-resistive element 10, write pulse currents are passed to the wires 322, 323 and a synthetic magnetic field induced by these currents is applied, whereby magnetization of a recording layer of the magneto-resistive element is appropriately reversed.

To read bit information, sense currents are passed through the wire 322, the magneto-resistive element 10 including the magnetic recording layer, and the lower electrode 324, and then a resistance value or a change of the resistance value of the magneto-resistive element 10 is measured.

Using the magneto-resistive element according to any of the above-described embodiments, the magnetic memory according to this embodiment, even with a miniaturized cell size, can ensure write and read by surely controlling magnetic domains of the recording layer.

OTHER EMBODIMENT

The present invention is not limited to the above-described embodiments, and expansion and modification can be made therein. The expanded and modified embodiments are also included in the technical scope of the present invention.

For the specific structure of the magneto-resistive film and the specific shapes and materials of the electrodes, bias applying film, insulation film, and the like, those skilled in the art can similarly implement the present invention to produce similar effects by making appropriate selections from the well-known ranges. For example, when the magneto-resistive element is applied to a magnetic reproducing head, detection resolution of the magnetic head can be defined by providing magnetic shields on the upper and lower sides of the element.

Further, the embodiments of the present invention are applicable not only to a magnetic head or a magnetic reproducing apparatus of a longitudinal magnetic recording type but to those of a perpendicular magnetic recording type.

Moreover, the magnetic reproducing apparatus of the present invention may be of a so-called fixed type that is constantly provided with a specific recording medium, or may be of a so-called "removable" type in which recording media are changeable.

Besides, the scope of the present invention also includes all the magneto-resistive elements, magnetic heads, magnetic recording/reproducing apparatuses, and magnetic memories that those skilled in the art can implement by appropriately changing the designs based on the magnetic head and the magnetic recording/reproducing apparatus described above as the embodiments of the present invention.

What is claimed is:

1. A magneto-resistive element, comprising:
a first magnetic layer having a substantially fixed magnetization direction;
a thin film layer disposed directly on said first magnetic layer, having a magnetization direction that changes depending on an external magnetic field, and comprising 50 atomic % or more of $TiO_x$, the thin film layer having a thickness of not less than 0.5 nm nor more than 3 nm; and
a second magnetic layer disposed directly on said thin film layer and having a substantially fixed magnetization direction.

2. The magneto-resistive element according to claim 1, wherein the magnetization directions of said first and second magnetic layers are substantially orthogonal to the magnetization direction of said thin film layer when no external magnetic field is applied.

3. The magneto-resistive element according to claim 1, wherein at least one of said first and second magnetic layers contains as a major component at least one element selected from iron (Fe), cobalt (Co), and nickel (Ni).

4. The magneto-resistive element according to claim 3, wherein at least one of said first and second magnetic layers contains at least one alloy selected from a face-centered cubic alloy of cobalt and iron (fcc-CoFe alloy), a body-centered cubic alloy of iron and cobalt (bcc-FeCo alloy), a face-centered cubic alloy of nickel and iron (fcc-NiFe alloy), and a hexagonal close-packed alloy of cobalt (hcp-Co alloy).

5. The magneto-resistive element according to claim 3, wherein at least one of said first and second magnetic layers comprises an amorphous alloy material.

6. The magneto-resistive element according to claim 5, wherein the amorphous alloy material contains as a major component one alloy selected from a cobalt-iron-boron (CoFeB) alloy, a cobalt-zirconium-niobium (CoZrNb) alloy, an iron-zirconium-nitrogen (FeZrN) alloy, and an iron-aluminum-silicon (FeAlSi) alloy.

7. The magneto-resistive element according to claim 1, further comprising
an antiferromagnetic layer or a hard magnetic layer fixing magnetization of at least one of said first and second magnetic layers.

8. The magneto-resistive element according to claim 7, wherein said antiferromagnetic layer comprises a manganese (Mn) alloy.

9. The magneto-resistive element according to claim 8, wherein the manganese (Mn) alloy contains as a major component one of iridium-manganese (IrMn) and platinum-manganese (PtMn).

10. The magneto-resistive element according to claim 7, wherein said hard magnetic layer contains as a major component at least one metal selected from cobalt (Co), cobalt-platinum (CoPt), cobalt-chromium-platinum (CoCrPt), and iron-platinum (FePt).

11. A magnetic head comprising the magneto-resistive element according to claim 1.

12. A magnetic recording apparatus comprising the magnetic head according to claim 11.

13. The magneto-resistive element according to claim 1, wherein the thin film layer further comprises at least one element selected from the group consisting of Fe, Co, Ni, Ti, Hf, Mg, Zr, V, Mn, Si, Cr, Nb, Ta, W, B and C.

* * * * *